US012811567B2

(12) United States Patent
Okada et al.

(10) Patent No.: US 12,811,567 B2
(45) Date of Patent: Nov. 24, 2026

(54) ACOUSTIC WAVE DEVICE

(71) Applicant: Murata Manufacturing Co., Ltd., Nagaokakyo (JP)

(72) Inventors: Takuro Okada, Nagaokakyo (JP); Yuta Ishii, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 92 days.

(21) Appl. No.: 18/901,302

(22) Filed: Sep. 30, 2024

(65) Prior Publication Data

US 2025/0023554 A1 Jan. 16, 2025

Related U.S. Application Data

(63) Continuation of application No. PCT/JP2023/013606, filed on Mar. 31, 2023.
(Continued)

(51) Int. Cl.
*H03H 9/02* (2006.01)
*H03H 9/13* (2006.01)
(Continued)

(52) U.S. Cl.
CPC ........ *H03H 9/564* (2013.01); *H03H 9/02031* (2013.01); *H03H 9/02157* (2013.01);
(Continued)

(58) Field of Classification Search
CPC ............... H03H 9/564; H03H 9/02031; H03H 9/02157; H03H 9/02228; H03H 9/132;
(Continued)

(56) References Cited

U.S. PATENT DOCUMENTS 12,034,427 B2 * 7/2024 Nagatomo ......... H03H 9/02015
2004/0100342 A1 5/2004 Nishihara et al.
(Continued)

FOREIGN PATENT DOCUMENTS

CN 114430885 A * 5/2022 ......... H03H 9/14538
JP 2004173191 A 6/2004
(Continued)

OTHER PUBLICATIONS

CN114430885A English Translation (Year: 2022).*
(Continued)

*Primary Examiner* — Andrea Lindgren Baltzell
*Assistant Examiner* — Abigail Amir Yaldo
(74) *Attorney, Agent, or Firm* — Keating & Bennett, LLP

(57) ABSTRACT

An acoustic wave device includes acoustic wave resonators each including a support substrate, a piezoelectric body layer, and a functional electrode. The support substrate includes a cavity portion overlapping a portion of the functional electrode in a first direction. The cavity portion is connected to an opening in a portion of the support substrate facing the piezoelectric body layer. The acoustic wave resonators include a first resonator and a second resonator with a larger intersecting width of the functional electrode than the first resonator. A taper angle of the first resonator is larger than a taper angle of the second resonator.

20 Claims, 18 Drawing Sheets

Related U.S. Application Data

(60) Provisional application No. 63/326,435, filed on Apr. 1, 2022.

(51) Int. Cl.
*H03H 9/17* (2006.01)
*H03H 9/56* (2006.01)

(52) U.S. Cl.
CPC ........ *H03H 9/02228* (2013.01); *H03H 9/132* (2013.01); *H03H 9/173* (2013.01); *H03H 9/176* (2013.01); *H03H 9/562* (2013.01); *H03H 9/568* (2013.01)

(58) Field of Classification Search
CPC ........ H03H 9/173; H03H 9/176; H03H 9/562; H03H 9/568
USPC .......................................................... 333/192
See application file for complete search history.

(56) References Cited

U.S. PATENT DOCUMENTS

| | | | |
|---|---|---|---|
| 2007/0296523 | A1 | 12/2007 | Yamakawa et al. |
| 2013/0147577 | A1 | 6/2013 | Nishihara et al. |
| 2019/0097602 | A1 | 3/2019 | Kimura |

FOREIGN PATENT DOCUMENTS

| | | | |
|---|---|---|---|
| JP | 2008035493 | A | 2/2008 |
| JP | 2012257019 | A | 12/2012 |
| JP | 2013123184 | A | 6/2013 |
| JP | 2019062441 | A | 4/2019 |

OTHER PUBLICATIONS

International Search Report in PCT/JP2023/013606, mailed Jun. 20, 2023, 2 pages.

Written Opinion in PCT/JP2023/013606, mailed Jun. 20, 2023, 4 pages.

* cited by examiner

ACOUSTIC WAVE DEVICE

CROSS REFERENCE TO RELATED APPLICATIONS

This application claims the benefit of priority to Provisional Application No. 63/326,435 filed on Apr. 1, 2022 and is a Continuation Application of PCT Application No. PCT/JP2023/013606 filed on Mar. 31, 2023. The entire contents of each application are hereby incorporated herein by reference.

BACKGROUND OF THE INVENTION

1. Field of the Invention

The present disclosure relates to acoustic wave devices each including a piezoelectric layer.

2. Description of the Related Art

For example, Japanese Unexamined Patent Application Publication No. 2012-257019 discloses an acoustic wave device using a plate wave. The acoustic wave device described in Japanese Unexamined Patent Application Publication No. 2012-257019 includes a support body, a piezoelectric substrate, and an IDT electrode. A cavity portion is provided in the support body. The piezoelectric substrate is provided on the support body to overlap the cavity portion. The IDT electrode is provided on the piezoelectric substrate to overlap the cavity portion. In the acoustic wave device, a plate wave is excited by the IDT electrode. An end edge portion of the cavity portion does not include a linear portion extending parallel to a propagation direction of the plate wave excited by the IDT electrode.

In recent years, in an acoustic wave device including a plurality of acoustic wave resonators, there has been a demand for an acoustic wave device which can reduce or prevent deterioration in electric power handling capability of an acoustic wave resonator having a large intersecting width.

SUMMARY OF THE INVENTION

Example embodiments of the present invention provide acoustic wave devices which are each able to reduce or prevent deterioration in electric power handling capability of an acoustic wave resonator having a large intersecting width, in a plurality of acoustic wave resonators.

An acoustic wave device according to an example embodiment of the present invention includes a plurality of acoustic wave resonators. Each of the plurality of acoustic wave resonators includes a support substrate, a piezoelectric body layer on the support substrate, and a functional electrode on the piezoelectric body layer. The support substrate includes a cavity portion at a position overlapping a portion of the functional electrode in a first direction which is a lamination direction of the support substrate and the piezoelectric body layer. The cavity portion is connected to an opening located in a portion of the support substrate facing the piezoelectric body layer. The plurality of acoustic wave resonators include a first resonator and a second resonator with a larger intersecting width of the functional electrode than the first resonator. In a cross section along the first direction and a second direction which is a direction in which a current flows inside the acoustic wave resonator, when an angle between the support substrate defining a portion connected to one end of the opening in the second direction in the cavity portion and the piezoelectric body layer is defined as a taper angle, the taper angle of the first resonator is larger than the taper angle of the second resonator.

According to example embodiments of present invention, it is possible to provide acoustic wave devices which are each able to reduce or prevent deterioration in electric power handling capability of an acoustic wave resonator with a large intersecting width, in a plurality of acoustic wave resonators.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Hereinafter, example embodiments of the present invention will be described with reference to accompanying drawings. The following description is merely an example, and is not intended to limit the present invention, applications of the present invention, or uses of the present invention. The drawings are schematic, and a ratio of each dimension and the like do not necessarily match actual ones.

Acoustic wave devices according to example embodiments of the present invention which are fundamental concepts of the present disclosure will be described with reference to FIGS. 1A to 12.

For example, an acoustic wave device according to an example embodiment of the present invention includes a piezoelectric layer including, for example, lithium niobate or lithium tantalate, and a first electrode and a second electrode which face each other in a direction intersecting a thickness direction of the piezoelectric layer.

In an acoustic wave device according to an example embodiment of the present invention, a bulk wave of thickness shear primary mode is used.

In addition, in an acoustic wave device according to an example embodiment of the present invention, the first electrode and the second electrode are adjacent electrodes, and d/p is, for example, about 0.5 or smaller, where d is a thickness of the piezoelectric layer and p is a center-to-center distance between the first electrode and the second electrode. As a result, in the first and second aspects, a Q value can be increased even when miniaturization is promoted.

In addition, in an acoustic wave device according to an example embodiment of the present invention, Lamb waves are used as plate waves. Then, resonance characteristics due to the Lamb wave can be obtained.

An acoustic wave device according to an example embodiment of the present invention includes a piezoelectric layer including, for example, lithium niobate or lithium tantalate, and an upper electrode and a lower electrode facing each other in a thickness direction of the piezoelectric layer with the piezoelectric layer interposed therebetween, and uses bulk waves.

Hereinafter, the present disclosure will be clarified by describing specific example embodiments of the present invention with reference to the drawings.

Each example embodiment described in the present specification is merely an example, and configurations can be partially replaced or combined with each other between different example embodiments.

Figure 1A:
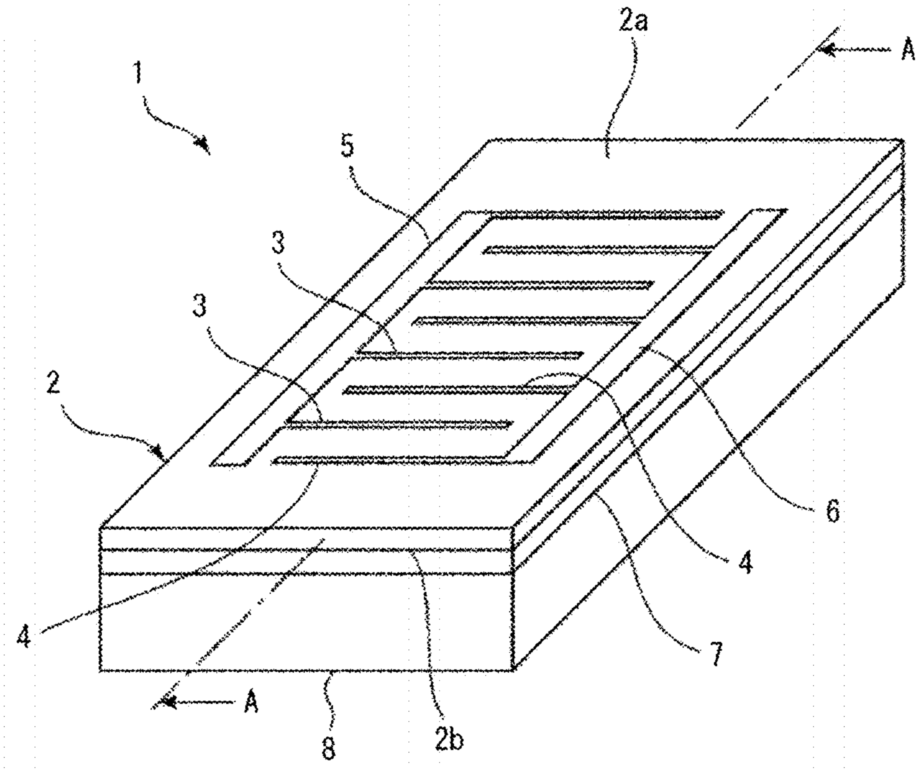
FIG. 1A is a schematic perspective view showing an appearance of an acoustic wave device according to an example embodiment of the present invention.
Figure 1B:
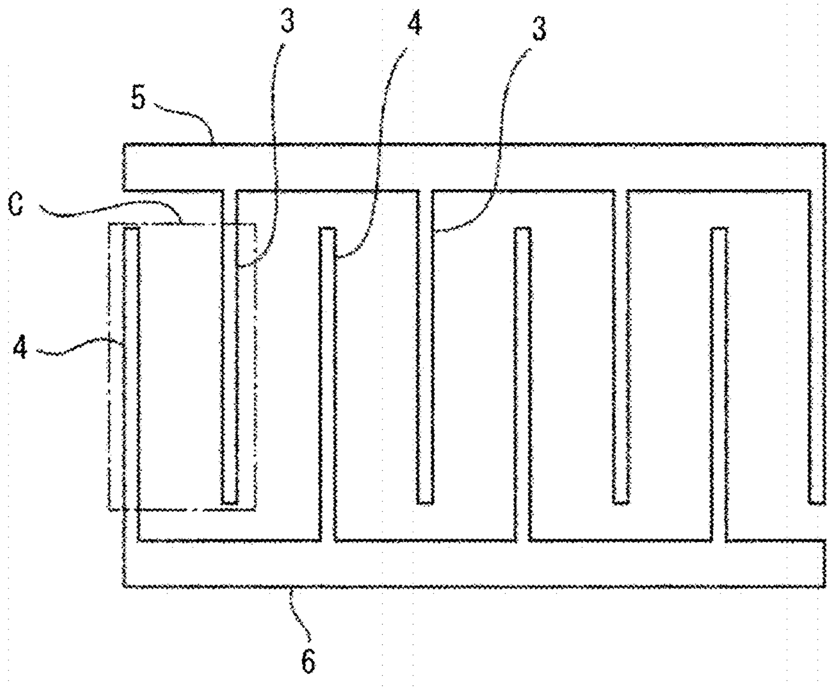
FIG. 1B is a plan view showing an electrode structure on a piezoelectric layer.
Figure 2:
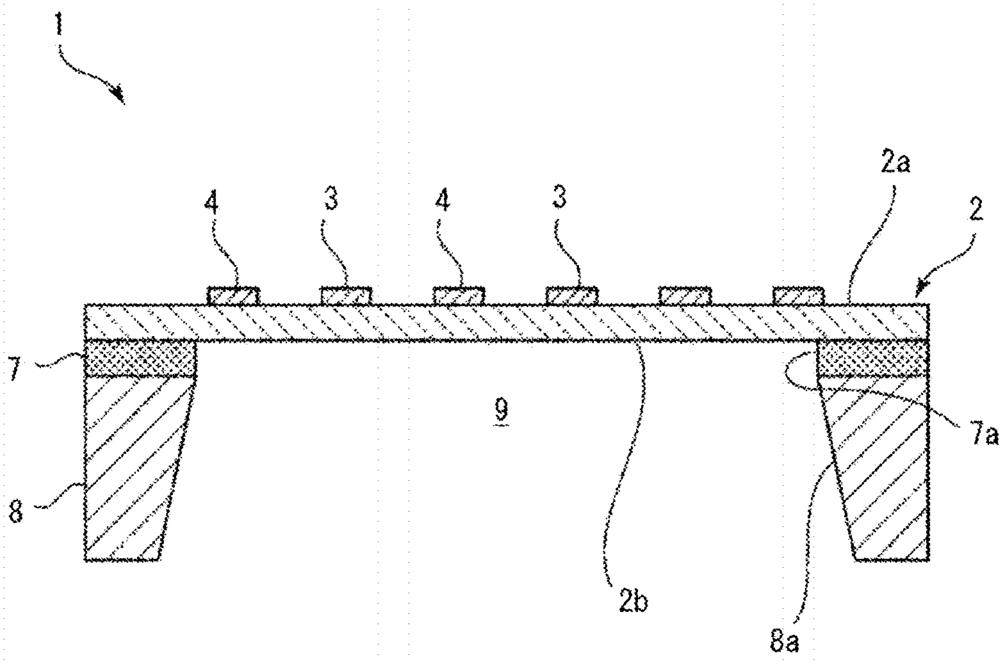
FIG. 2 is a cross-sectional view of a portion taken along line A-A in FIG. 1A.

FIG. 1A is a schematic perspective view showing an appearance of an acoustic wave device according to an example embodiment, FIG. 1B is a plan view showing an electrode structure on a piezoelectric layer, and FIG. 2 is a cross-sectional view of a portion taken along line A-A in FIG. 1A.

The acoustic wave device 1 includes a piezoelectric layer 2 made of $LiNbO_3$, for example. The piezoelectric layer 2 may be made of $LiTaO_3$, for example. Cut-angles of $LiNbO_3$ and $LiTaO_3$ are Z-cut in the present example embodiment, but may be rotational Y-cut or X-cut. Preferably, for example, a propagation orientation of about ±30° for Y propagation and X propagation may be used. The thickness of the piezoelectric layer 2 is not particularly limited, but is, for example, preferably about 50 nm or more and about 1000 nm or smaller in order to effectively excite the thickness shear primary mode.

The piezoelectric layer 2 includes first and second main surfaces 2*a* and 2*b* facing each other. Electrodes 3 and 4 are provided on the first main surface 2*a*. Here, the electrode 3 is an example of a "first electrode", and the electrode 4 is an example of a "second electrode". In FIGS. 1A and 1B, a plurality of electrodes 3 are a plurality of first electrode fingers connected to a first busbar 5. The plurality of electrodes 4 are a plurality of second electrode fingers connected to a second busbar 6. The plurality of electrodes 3 and the plurality of electrodes 4 are interdigitated with each other.

The electrode 3 and the electrode 4 have a rectangular or substantially rectangular shape, and have a length direction. The electrode 3 and the electrode 4 adjacent thereto face each other in a direction orthogonal or substantially orthogonal to the length direction. The plurality of electrodes 3 and 4, the first busbar 5 and the second busbar 6 define an Interdigital Transducer (IDT) electrode. Both the length directions of the electrodes 3 and 4 and the direction orthogonal to the length direction of the electrodes 3 and 4 are directions intersecting the thickness direction of the piezoelectric layer 2. Therefore, it can be said that the electrode 3 and the adjacent electrode 4 face each other in the direction intersecting the thickness direction of the piezoelectric layer 2.

In addition, the length direction of the electrodes 3 and 4 may be replaced with the direction orthogonal or substantially orthogonal to the length direction of the electrodes 3 and 4 shown in FIGS. 1A and 1B. That is, in FIGS. 1A and 1B, the electrodes 3 and 4 may extend in the direction in which the first busbar 5 and the second busbar 6 extend. In that case, the first busbar 5 and the second busbar 6 extend in the direction in which the electrodes 3 and 4 extend in FIGS. 1A and 1B.

A plurality of pairs of structures in which the electrode 3 connected to one potential and the electrode 4 connected to the other potential are adjacent to each other are provided in the direction orthogonal to the length direction of the electrodes 3 and 4. Here, a case where the electrodes 3 and 4 are adjacent to each other does not mean a case where the electrodes 3 and 4 are disposed to be in direct contact with each other, but means a case where the electrodes 3 and 4 are disposed with an interval therebetween.

When the electrodes 3 and 4 are adjacent to each other, no electrodes connected to a hot electrode or a ground electrode, including the other electrodes 3 and 4, are disposed between the electrodes 3 and 4. The number of pairs does not need to be integer pairs, but may be 1.5 pairs, 2.5 pairs, or the like. The center-to-center distance, that is, a pitch between the electrodes 3 and 4 is, for example, preferably in a range of about 1 μm or larger and about 10 μm or smaller. In addition, the center-to-center distance between the electrodes 3 and 4 is a distance connecting a center of a width dimension of the electrode 3 in the direction orthogonal to the length direction of the electrode 3 and a center of a width dimension of the electrode 4 in the direction orthogonal or substantially orthogonal to the length direction of the electrode 4. Furthermore, when at least one of the electrodes 3 and 4 is a plurality of electrodes (when the electrodes 3 and 4 are a pair of electrodes and there are 1.5 or more pairs of electrodes), the center-to-center distance between the electrodes 3 and 4 refers to the average value of the center-to-center distances of the adjacent electrodes 3 and 4 in the 1.5 or more pairs of electrodes 3 and 4. In addition, the width of the electrodes 3 and 4, that is, the dimension in the facing direction of the electrodes 3 and 4 is, for example, preferably in the range of about 150 nm or more and about 1000 nm or smaller. The center-to-center distance between the electrodes 3 and 4 is a distance connecting the center of the dimension (width dimension) of the electrode 3 in the direction orthogonal or substantially orthogonal to the length direction of the electrode 3 and the center of the dimension (width dimension) of the electrode 4 in the direction orthogonal or substantially orthogonal to the length direction of the electrode 4.

In the present example embodiment, since the Z-cut piezoelectric layer is used, the direction orthogonal or substantially orthogonal to the length direction of the electrodes 3 and 4 is the direction orthogonal to a polarization direction of the piezoelectric layer 2. When piezoelectric materials with different cut-angles are used as the piezoelectric layer 2, this case is an exception. Here, "orthogonal" is not limited to being strictly orthogonal, but may be substantially orthogonal (an angle between the direction orthogonal to the length direction of the electrodes 3 and 4 and the polarization direction is, for example, about 90°±10°).

A support 8 is laminated on the second main surface 2*b* side of the piezoelectric layer 2 with an insulating layer 7 interposed therebetween. The insulating layer 7 and the support 8 have a frame shape and, as shown in FIG. 2, include cavities 7*a* and 8*a*. In this manner, a cavity portion 9 is provided. The cavity portion 9 is provided not to disturb the vibration of the excitation region C of the piezoelectric layer 2. Therefore, the support 8 is laminated on the second main surface 2*b* with the insulating layer 7 interposed therebetween at a position not overlapping the portion where at least the pair of electrodes 3 and 4 are provided. The insulating layer 7 does not have to be provided. Therefore, the support 8 can be directly or indirectly laminated on the second main surface 2*b* of the piezoelectric layer 2.

The insulating layer 7 is made of silicon oxide, for example. In addition to silicon oxide, an appropriate insulating material such as, for example, silicon oxynitride or alumina can be used. The support 8 is made of Si, for example. A plane orientation of a surface of Si on the piezoelectric layer 2 side may be (100), (110), or (111). Preferably, for example, high-resistance Si having a resistivity of about 4 kΩ or more is provided. The support 8 can also be made of an appropriate insulating material or semiconductor material. Examples of the material of the support 8 include piezoelectric materials such as aluminum oxide, lithium tantalate, lithium niobate, and quartz crystal, various ceramics such as alumina, magnesia, sapphire, silicon nitride, aluminum nitride, silicon carbide, zirconia, cordierite, mullite, steatite, and forsterite, dielectrics such as diamond and glass, and semiconductors such as gallium nitride.

The plurality of electrodes 3 and 4 and the first and second busbars 5 and 6 are made of appropriate metal or alloys such as, for example, Al and AlCu alloys. In the present example embodiment, for example, the electrodes 3 and 4 and the first and second busbars 5 and 6 have a structure in which an Al film is laminated on a Ti film. A close contact layer other than the Ti film may be used.

During driving, an alternating current voltage is applied between the plurality of electrodes 3 and the plurality of electrodes 4. More specifically, the alternating current voltage is applied between the first busbar 5 and the second busbar 6. As a result, it is possible to obtain resonance characteristics using bulk waves of the thickness shear primary mode excited in the piezoelectric layer 2.

In the acoustic wave device 1, when the thickness of the piezoelectric layer 2 is defined as d and the center-to-center distance between any adjacent electrodes 3 and 4 in the plurality of pairs of electrodes 3 and 4 is defined as p, d/p is, for example, about 0.5 or smaller. As a result, the bulk waves of the thickness shear primary mode are effectively excited, and satisfactory resonance characteristics can be obtained. More preferably, for example, d/p is about 0.24 or smaller, and in this case, more satisfactory resonance characteristics can be obtained.

When at least one of the electrodes 3 and 4 is plural as in the present example embodiment, that is, when the electrodes 3 and 4 form one pair of electrodes and there are 1.5 or more pairs of the electrodes 3 and 4, the center-to-center distance p between the adjacent electrodes 3 and 4 is the average distance between the center-to-center distances of the adjacent electrodes 3 and 4.

Since the above-described configuration is provided in the acoustic wave device 1 of the present example embodiment, even when the number of pairs of the electrodes 3 and 4 is reduced in order to reduce the size, a Q value is unlikely to decrease. This is because the resonator does not require reflectors on both sides, and a propagation loss is small. In addition, the reason why the above reflector is not required is that the bulk wave of the thickness shear primary mode is used.

A difference between the Lamb wave used in the acoustic wave device of the related art and the bulk wave of the thickness shear primary mode will be described with reference to FIGS. 3A and 3B.

Figure 3A:
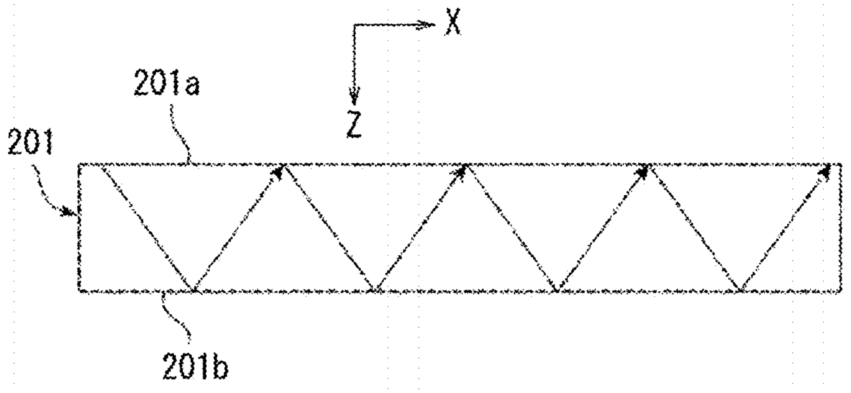
FIG. 3A is a schematic elevational cross-sectional view for describing a Lamb wave propagating through a piezoelectric film of an acoustic wave device in the related art.

FIG. 3A is a schematic elevational cross-sectional view for describing Lamb waves propagating through a piezoelectric film of the acoustic wave device in the related art. For example, the acoustic wave device in the related art is described in Japanese Unexamined Patent Application Publication No. 2012-257019. As shown in FIG. 3A, in the acoustic wave device of the related art, waves propagate through a piezoelectric film 201 as indicated by arrows. Here, in the piezoelectric film 201, a first main surface 201*a* and a second main surface 201*b* face each other, and the thickness direction connecting the first main surface 201*a* and the second main surface 201*b* is a Z-direction. An X-direction is a direction in which the electrode fingers of the IDT electrodes are aligned. As shown in FIG. 3A, in the Lamb wave, the wave propagates in the X-direction as shown in FIG. 3A. Since the wave is a plate wave, the piezoelectric film 201 vibrates as a whole. Since the wave propagates in the X-direction, the reflectors are disposed on both sides to obtain the resonance characteristics. Therefore, the propagation loss of the wave occurs, and the Q value decreases when the size is reduced, that is, when the number of pairs of the electrode fingers is reduced.

Figure 3B:
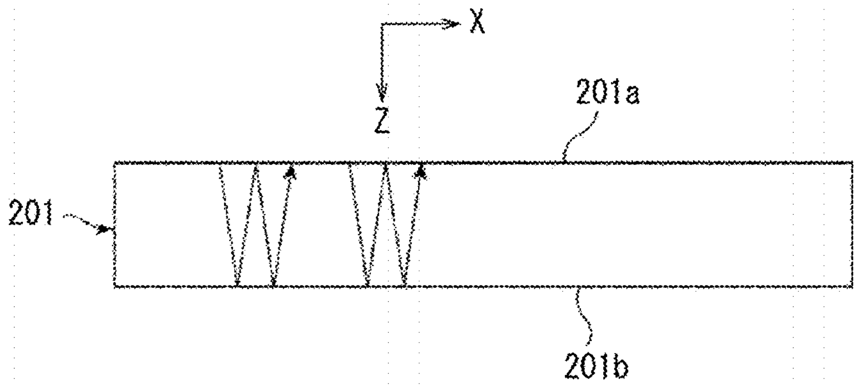
FIG. 3B is a schematic elevational cross-sectional view for describing a wave of an acoustic wave device according to an example embodiment of the present invention.

Meanwhile, as shown in FIG. 3B, in the acoustic wave device 1 of the present example embodiment, since a vibration displacement is in a thickness shear direction, the wave propagates and resonates substantially in the direction connecting the first main surface 2*a* and the second main surface 2*b* of the piezoelectric layer 2, that is, in the Z-direction. That is, an X-direction component of the wave is significantly smaller than a Z-direction component. Since resonance characteristics are obtained by propagating waves in the Z-direction, no reflector is required. Therefore, no propagation loss occurs when propagating to the reflector. Therefore, even when the number of electrode pairs including the electrodes 3 and 4 is reduced in an attempt to promote miniaturization, the Q value is unlikely to decrease.

Figure 4:
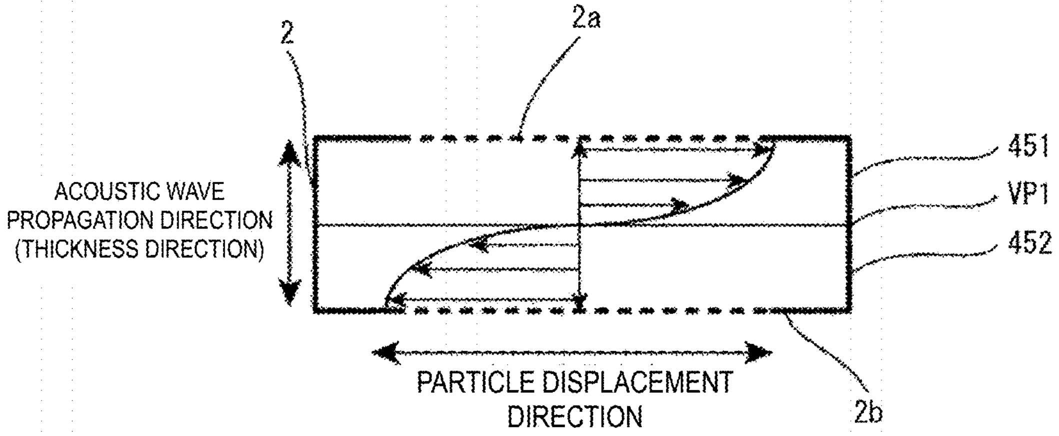
FIG. 4 is a schematic view showing a bulk wave when a voltage in which a second electrode has a higher potential than a first electrode is applied between the first electrode and the second electrode.

Amplitude directions of the bulk waves of the thickness shear primary mode are opposite to each other between a first region 451 included in the excitation region C of the piezoelectric layer 2 and a second region 452 included in the excitation region C, as shown in FIG. 4. FIG. 4 schematically shows bulk waves when a voltage in which the electrode 4 has a higher potential than the electrode 3 is applied between the electrodes 3 and 4. The first region 451 is a region of the excitation region C between a virtual plane VP1 orthogonal or substantially orthogonal to the thickness direction of the piezoelectric layer 2 and bisecting the piezoelectric layer 2, and the first main surface 2*a*. The second region 452 is a region of the excitation region C between the virtual plane VP1 and the second main surface 2*b*.

As described above, in the acoustic wave device 1, at least one pair of electrodes including the electrodes 3 and 4 is disposed. However, since waves are not propagated in the X-direction, the number of electrode pairs including the electrodes 3 and 4 does not necessarily need to be plural.

That is, at least one pair of electrodes may be provided.

For example, the electrode 3 is the electrode connected to the hot potential, and the electrode 4 is the electrode connected to the ground potential. The electrode 3 may be connected to the ground potential, and the electrode 4 may be connected to the hot potential. In the present example embodiment, at least a pair of electrodes is the electrodes connected to the hot potential or the electrodes connected to the ground potential, as described above, and no floating electrodes are provided.

Figure 5:
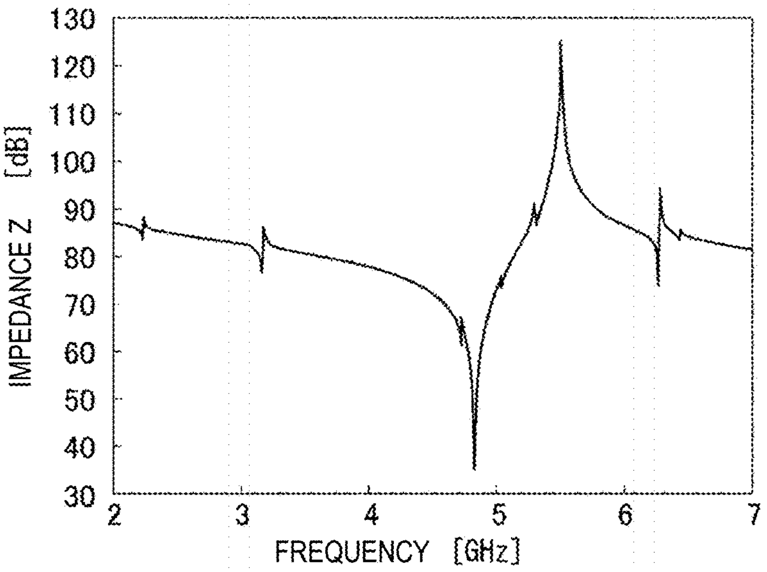
FIG. 5 is a view showing resonance characteristics of an acoustic wave device according to an example embodiment of the present invention.

FIG. 5 is a view showing the resonance characteristics of the acoustic wave device according to the present example embodiment. Design parameters of the acoustic wave device 1 having the resonance characteristics are as follows.

Piezoelectric layer 2: $LiNbO_3$ with Euler angles (0°, 0°, and) 90°, thickness=about 400 nm.

When viewed in the direction orthogonal to the length direction of the electrodes 3 and 4, the length of the region where the electrodes 3 and 4 overlap each other, that is, the length of the excitation region C=about 40 μm, the number of pairs of the electrodes including the electrodes 3 and 4=21 pairs, the center distance between the electrodes=3 μm, the width of the electrodes 3 and 4=about 500 nm, and d/p=about 0.133.

Insulating layer 7: silicon oxide film having the thickness of about 1 μm.

Support 8: Si.

The length of the excitation region C is the dimension along the length direction of the electrodes 3 and 4 of the excitation region C.

In the present example embodiment, the electrode-to-electrode distances of the electrode pairs of the electrodes 3 and 4 are all equal or substantially equal in the plurality of pairs. That is, the electrodes 3 and 4 are disposed at an equal or substantially equal pitch.

As is clear from FIG. 5, satisfactory resonance characteristics with a fractional bandwidth of about 12.5% are obtained in spite of including no reflector.

Incidentally, when the thickness of the piezoelectric layer 2 is d and the center-to-center distance of the electrodes 3 and 4 is p, in the present example embodiment, as described above, d/p is, for example, about 0.5 or smaller, and more preferably about 0.24 or smaller. This will be described with reference to FIG. 6.

Figure 6:
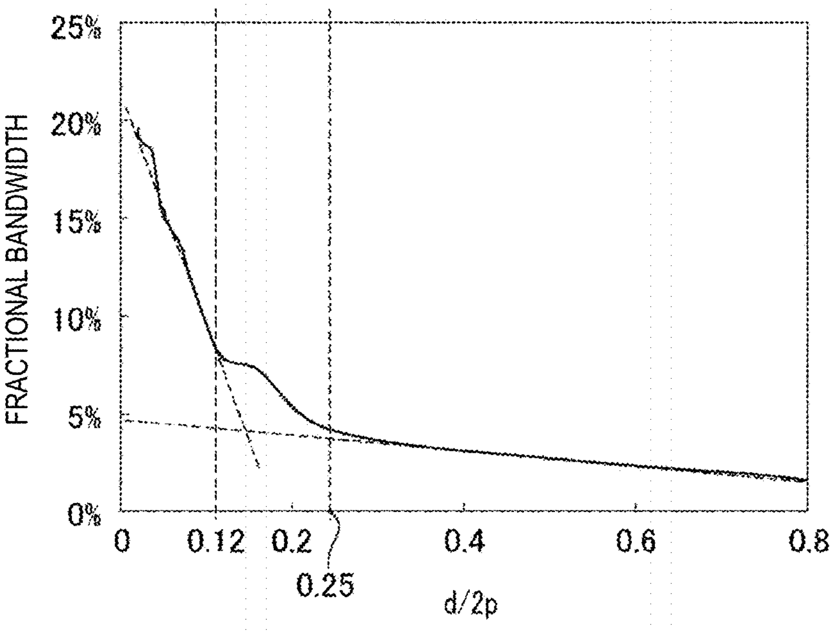
FIG. 6 is a view showing a relationship between d/2p and a fractional bandwidth as a resonator of an acoustic wave device according to an example embodiment of the present invention.

A plurality of acoustic wave devices were obtained by changing d/2p in the same or substantially the same manner as the acoustic wave device with the resonance characteristics shown in FIG. 5. FIG. 6 is a view showing a relationship between this d/2p and the fractional bandwidth as the resonator of the acoustic wave device.

As is clear from FIG. 6, when d/2p exceeds about 0.25, that is, when d/p>about 0.5, even when d/p is adjusted, the fractional bandwidth is less than about 5%. Meanwhile, when d/2p≤about 0.25, that is, d/p≤about 0.5, the fractional bandwidth can be increased to about 5% or more by changing d/p within that range, that is, a resonator having a high coupling coefficient can be provided. In addition, when d/2p is about 0.12 or smaller, that is, when d/p is about 0.24 or smaller, the fractional bandwidth can be increased to about 7% or more. In addition, when d/p is adjusted within this range, a resonator having a wider fractional bandwidth can be obtained, and a resonator having a higher coupling coefficient can be achieved. Therefore, it can be understood that a resonator using the bulk wave of the thickness shear primary mode and having the high coupling coefficient can be provided by adjusting d/p to about 0.5 or smaller, for example.

As described above, at least one pair of electrodes may be one pair, and p is the center-to-center distance between adjacent electrodes 3 and 4 in the case of one pair of electrodes. In the case of 1.5 pairs or more of electrodes, the average distance of the center-to-center distances of the adjacent electrodes 3 and 4 may be defined as p.

As for the thickness d of the piezoelectric layer, when the piezoelectric layer 2 has variations in thickness, a value obtained by averaging the thickness may be used.

Figure 7:
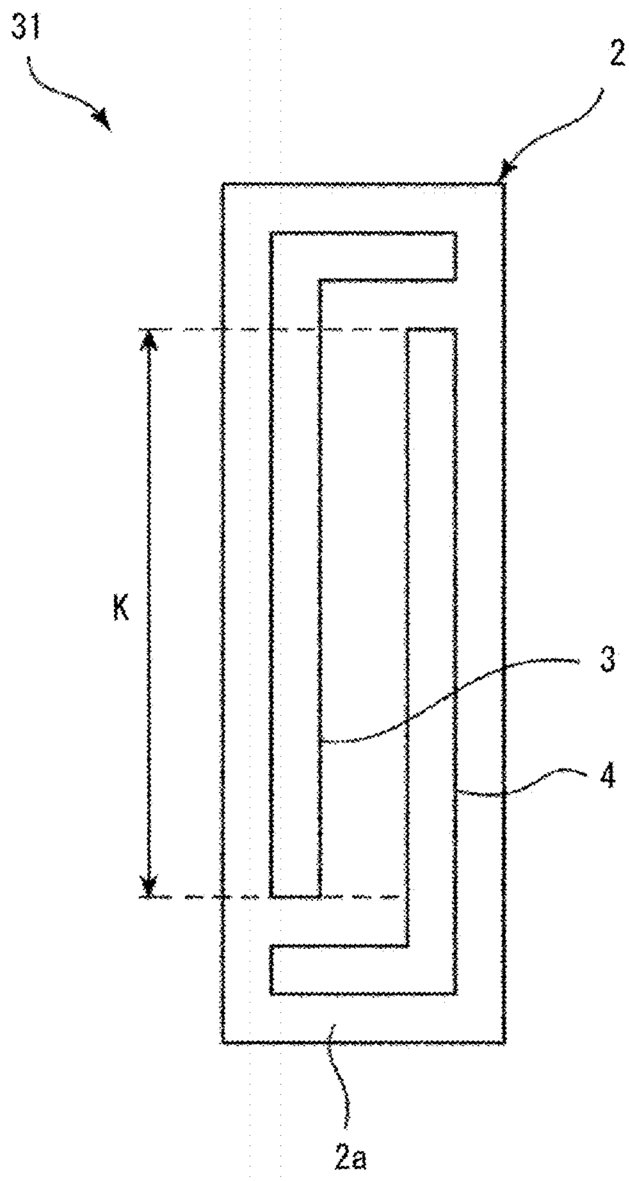
FIG. 7 is a plan view of another acoustic wave device according to an example embodiment of the present invention.

FIG. 7 is a plan view of another acoustic wave device according to the example embodiment of the present disclosure. In an acoustic wave device 31, a pair of electrodes having the electrode 3 and electrode 4 is provided on the first main surface 2*a* of the piezoelectric layer 2. Note that K in FIG. 7 is an intersecting width.

As described above, in the acoustic wave device 31 of the present disclosure, the number of pairs of electrodes may be one. Even in this case, when the above d/p is, for example, about 0.5 or smaller, it is possible to effectively excite the bulk wave in the thickness shear primary mode.

In the acoustic wave device 1, preferably, for example, in the plurality of electrodes 3 and 4, the metallization ratio MR of the adjacent electrodes 3 and 4 with respect to the excitation region, which is the region where any of the adjacent electrodes 3 and 4 overlap each other when viewed in the facing direction, satisfies MR≤about 1.75(d/p)+0.075. That is, a region where the plurality of first electrode fingers and the plurality of second electrode fingers overlap each other is the excitation region (crossing region) when the plurality of first electrode fingers and the plurality of second electrode fingers are viewed in a direction in which the plurality of first electrode fingers and the plurality of second electrode fingers adjacent to each other face each other. When the metallization ratio of the plurality of first electrode fingers and the plurality of second electrode fingers to the excitation region is defined as MR, it is preferable to satisfy MR≤about 1.75(d/p)+0.075, for example. In this case, the spurious response can be effectively reduced.

Figure 8:
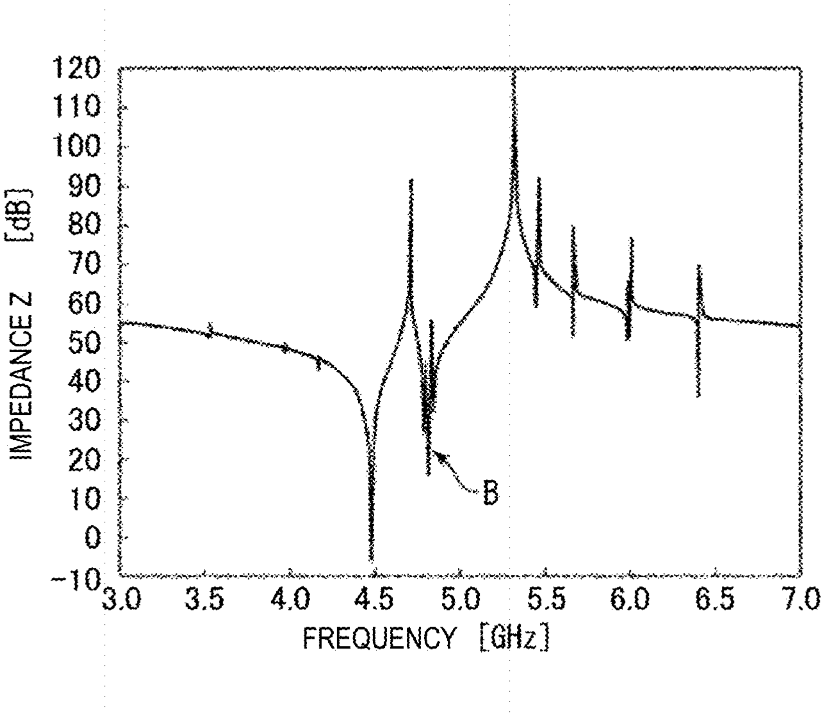
FIG. 8 is a reference view showing an example of the resonance characteristics of an acoustic wave device according to an example embodiment of the present invention.

This will be described with reference to FIGS. 8 and 9. FIG. 8 is a reference diagram showing an example of the resonance characteristics of the acoustic wave device 1. For example, the spurious response indicated by an arrow B appears between the resonant frequency and the anti-resonant frequency. In the example, d/p=about 0.08 is set, and the Euler angles (0°, 0°, 90°) of $LiNbO_3$ are set. In addition, the metallization ratio MR=about 0.35 is set.

The metallization ratio MR will be described with reference to FIG. 1B. In the electrode structure in FIG. 1B, when focusing on the pair of electrodes 3 and 4, it is assumed that only the pair of electrodes 3 and 4 is provided. In this case, a portion surrounded by a one-dot chain line C is the excitation region. When the electrodes 3 and 4 are viewed in the direction orthogonal to the length direction of the electrodes 3 and 4, that is, in the facing direction, the excitation region is a region where the electrode 3 overlaps the electrode 4, a region where the electrode 4 overlaps the electrode 3, and a region where the electrode 3 and the electrode 4 overlap each other in a region between the electrode 3 and the electrode 4. An area of the electrodes 3 and 4 in the excitation region C with respect to an area of this excitation region is the metallization ratio MR. That is, the metallization ratio MR is the ratio of the area of the metallization portion with respect to the area of the excitation region.

When the plurality of pairs of electrodes are provided, a ratio of the metallization portion included in the entire excitation region with respect to a total area of the excitation region may be MR.

Figure 9:
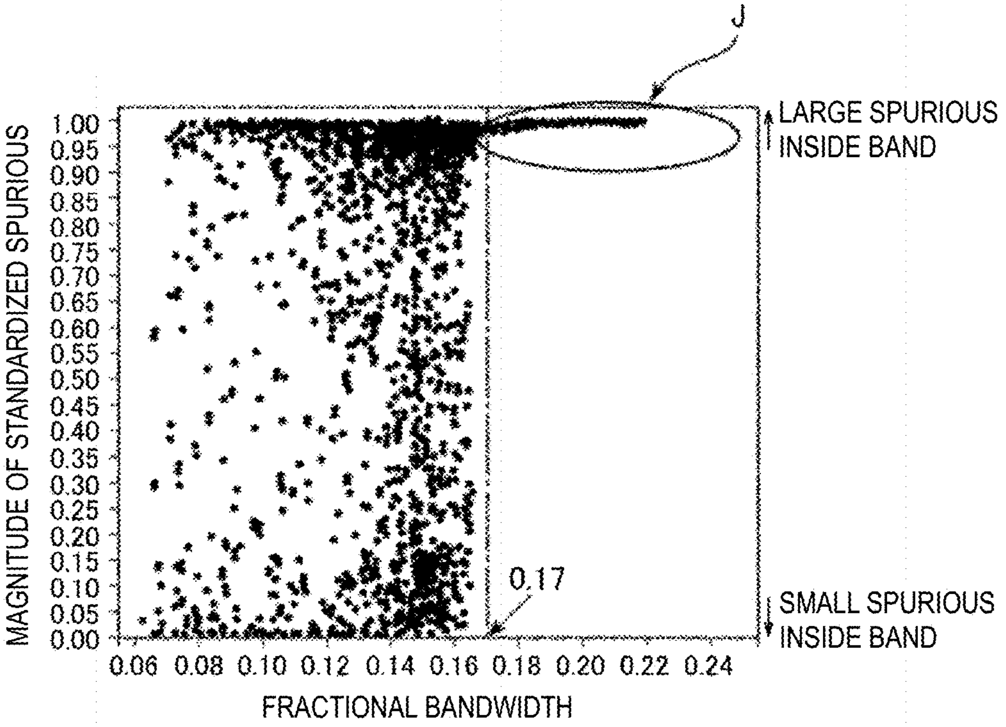
FIG. 9 is a view showing a relationship between a fractional bandwidth and a phase rotation amount of impedance of a spurious standardized at about 180 degrees as a magnitude of the spurious response when a large number of acoustic wave resonators are provided.

FIG. 9 is a view showing a relationship between the fractional bandwidth and a phase rotation amount of the spurious impedance standardized by about 180 degrees as the magnitude of the spurious when a large number of acoustic wave resonators are configured according to the present example embodiment. The fractional bandwidth is adjusted by changing a film thickness of the piezoelectric layer and a dimension of the electrode in various ways. In addition, FIG. 9 shows the results when a Z-cut $LiNbO_3$ piezoelectric layer is used, but the same or substantially the same tendency is obtained when piezoelectric layers with other cut-angles are used.

In a region surrounded by an ellipse J in FIG. 9, the spurious is as large as about 1.0. As is clear from FIG. 9, when the fractional bandwidth exceeds about 0.17, that is, exceeds about 17%, a large spurious response with a spurious level of about 1 or higher appears in a pass band even when the parameters defining the fractional bandwidth are changed. That is, as in the resonance characteristics shown in FIG. 8, a large spurious response indicated by an arrow B appears within the band. Therefore, the fractional bandwidth is, for example, preferably about 17% or smaller. In this case, the spurious response can be reduced by adjusting the film thickness of the piezoelectric layer 2 and the dimensions of the electrodes 3 and 4.

Figure 10:
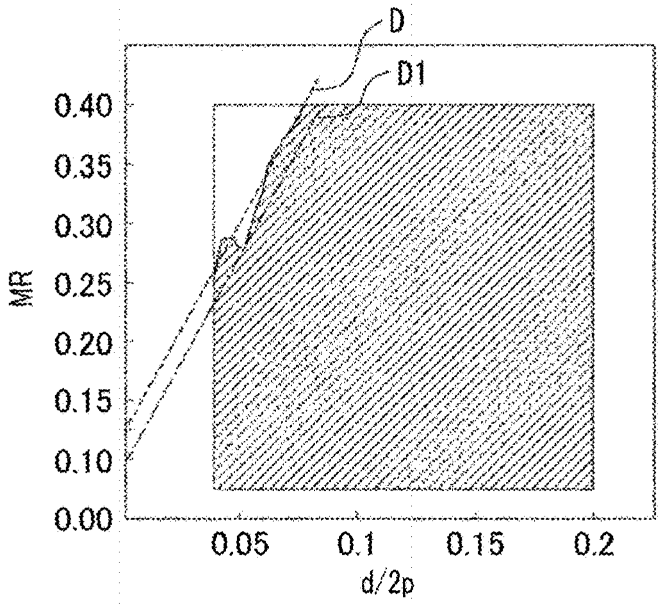
FIG. 10 is a view showing a relationship between d/2p, a metallization ratio MR, and a fractional bandwidth.

FIG. 10 is a view showing a relationship between d/2p, the metallization ratio MR, and the fractional bandwidth. In the acoustic wave device described above, various acoustic wave devices having different d/2p and MR are provided, and the fractional bandwidth is measured. A hatched portion on a right side of a broken line D in FIG. 10 is the region where the fractional bandwidth is about 17% or smaller. A boundary between the hatched region and a non-hatched region is expressed by MR=about 3.5(d/2p)+0.075. That is, MR=about 1.75(d/p)+0.075. Therefore, for example, preferably, MR≤about 1.75(d/p)+0.075. In this case, it is easy to set the fractional bandwidth to about 17% or smaller. A region on a right side of MR=about 3.5 (d/2p)+0.05 indicated by a dashed-dotted line D1 in FIG. 10 is more preferable. That is, in a case of MR≤about 1.75 (d/p)+0.05, the fractional bandwidth can be reliably set to about 17% or smaller.

Figure 11:
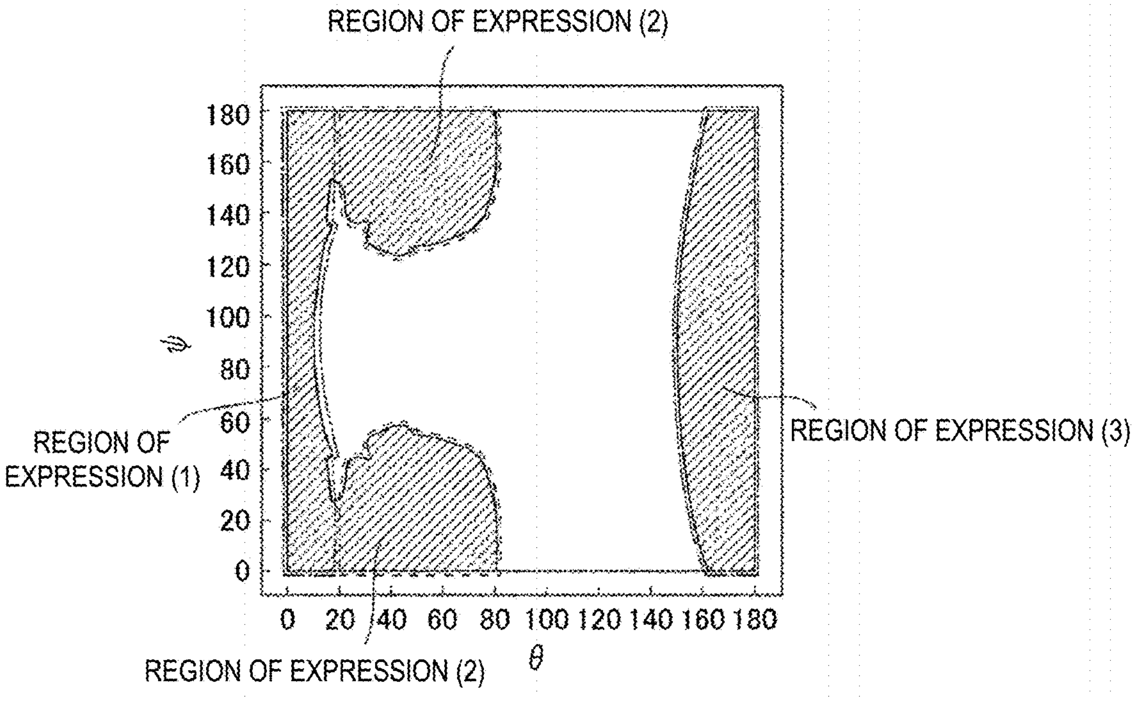
FIG. 11 is a view showing a map of a fractional bandwidth with respect to Euler angles (0°, θ, and ψ) of $LiNbO_3$ when d/p is infinitely close to 0.

FIG. 11 is a view showing a map of the fractional bandwidth with respect to the Euler angles (0°, θ, ψ) of $LiNbO_3$ when d/p is infinitely close to 0. A hatched portion in FIG. 11 is a region where the fractional bandwidth of at least 5% or more is obtained, and the range of the region is approximated by the following Expressions (1), (2), and (3).

$$(0° \pm 10°,\ 0° \text{ to } 20°,\ \text{any } \psi) \qquad \text{Expression (1)}$$

$$(0° \pm 10°,\ 20° \text{ to } 80°,\ 0° \text{ to } 60°(1-(\theta-50)^2/900)^{1/2}) \text{ or} \qquad \text{Expression (2)}$$

$$(0° \pm 10°,\ 20° \text{ to } 80°,\ [180° - 60°(1-(\theta-50)^2/900)^{1/2}] \text{ to } 180°)$$

$$(0° \pm 10°,\ [180° - 30°(1-(\psi-90)^2/8100)^{1/2}] \text{ to } 180°,\ \text{any } \psi) \qquad \text{Expression (3)}$$

Therefore, in a case of the Euler angle range of Expression (1), Expression (2), or Expression (3), it is preferable since the fractional bandwidth can be sufficiently widened.

Figure 12:
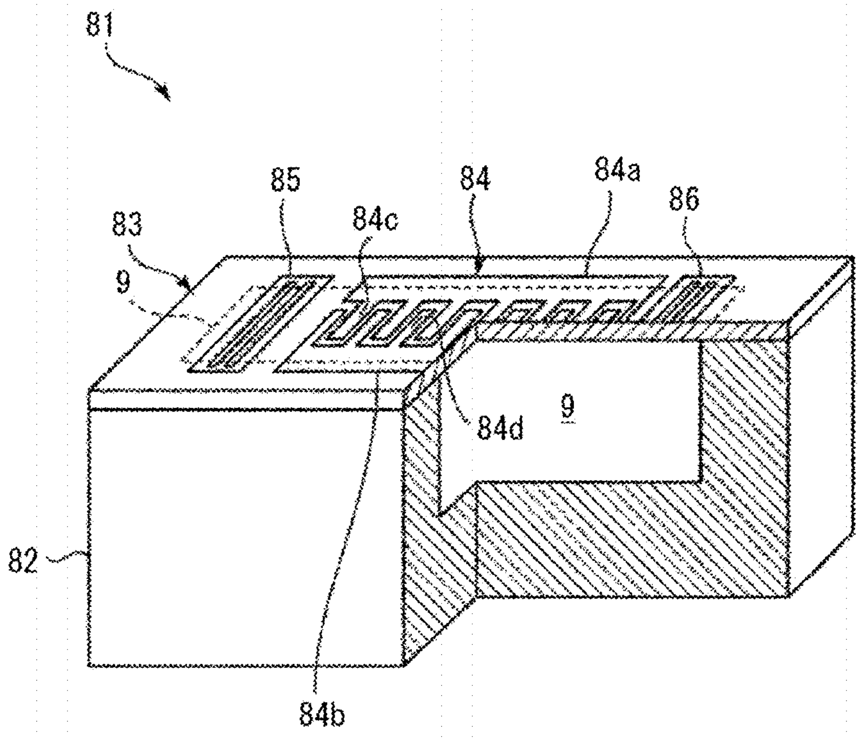
FIG. 12 is a partially cutaway perspective view for describing an acoustic wave device according to an example embodiment of the present invention.

FIG. 12 is a partially cutaway perspective view for describing the acoustic wave device according to a modified example of an example embodiment of the present invention. An acoustic wave device 81 includes a support substrate 82. The support substrate 82 is provided with a recess portion that is open on an upper surface. A piezoelectric layer 83 is laminated on the support substrate 82. As a result, a cavity portion 9 is provided. An IDT electrode 84 is provided on the piezoelectric layer 83 above the cavity portion 9. Reflectors 85 and 86 are provided on both sides of the IDT electrode 84 in an acoustic wave propagation direction. In FIG. 12, an outer periphery of the cavity portion 9 is indicated by broken lines. Here, the IDT electrode 84 includes first and second busbars 84*a* and 84*b*, electrodes 84*c* as a plurality of first electrode fingers, and electrodes 84*d* as a plurality of second electrode fingers. The plurality of electrodes 84*c* are connected to the first busbar 84*a*. The plurality of electrodes 84*d* are connected to the second busbar 84*b*. The plurality of electrodes 84*c* and the plurality of electrodes 84*d* are interdigitated.

In the acoustic wave device 81, the Lamb wave as the plate wave is excited by applying an AC electric field to the IDT electrodes 84 on the cavity portion 9. Since the reflectors 85 and 86 are provided on both sides, the resonance characteristics caused by the Lamb wave can be obtained.

In this way, an acoustic wave device according to an example embodiment of the present invention may use a plate wave.

The acoustic wave device 1 according to an example embodiment of the present invention will be described with reference to FIGS. 13 and 14. In the following description, repeated contents of the acoustic wave devices according to example embodiments of the present invention will be omitted as appropriate. The following description can be applied to acoustic wave device according to example embodiments of the present invention.

Figure 13:
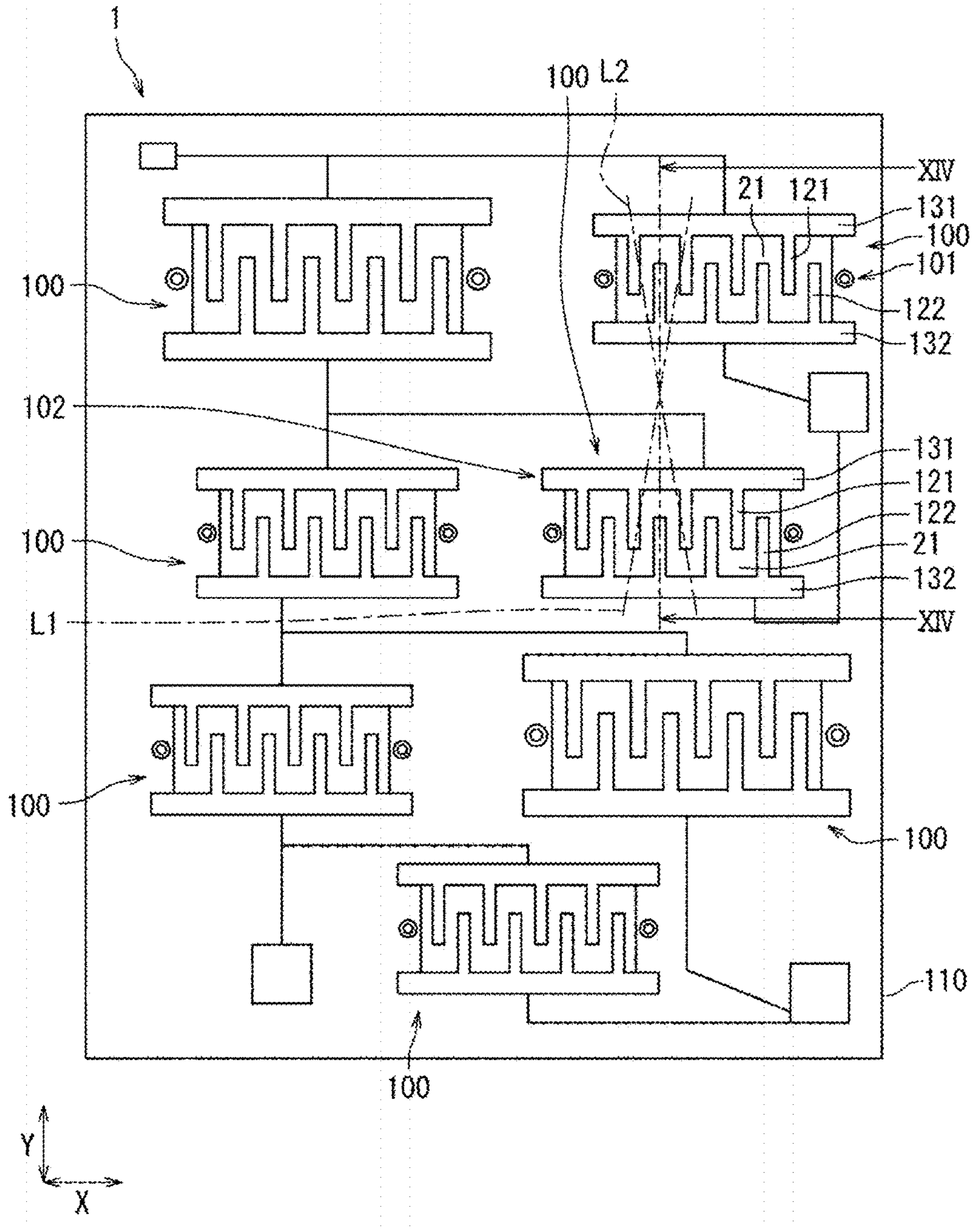
FIG. 13 is a plan view showing an acoustic wave device according to an example embodiment of the present invention.
Figure 14:
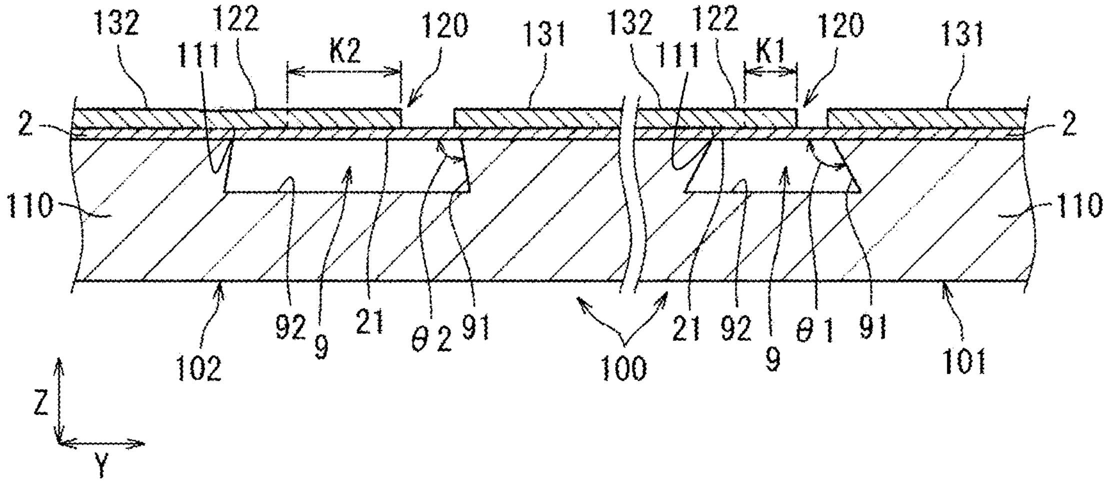
FIG. 14 is a cross-sectional view taken along line XIV-XIV in FIG. 13.

As shown in FIGS. 13 and 14, the acoustic wave device 1 includes a plurality of acoustic wave resonators 100. Each acoustic wave resonator 100 includes a support substrate 110, a piezoelectric layer 2, and a functional electrode 120. The piezoelectric layer 2 is provided on the support substrate 110. The functional electrode 120 is provided on the piezoelectric layer 2.

The support substrate 110 includes a cavity portion 9 provided at a position overlapping a portion of the functional electrode 120 in a first direction (for example, the Z-direction) which is the lamination direction of the support substrate 110 and the piezoelectric layer 2. An opening 111 is provided in a portion of the support substrate 110 which faces the piezoelectric layer 2. The cavity portion 9 is connected to opening 111.

In the present example embodiment, the opening 111 of the support substrate 110 is covered with the piezoelectric layer 2, and the cavity portion 9 is defined by the support substrate 110 and the piezoelectric layer 2. Another layer may be interposed between the piezoelectric layer 2 and the support substrate 110.

The piezoelectric layer 2 includes a membrane portion 21. For example, the membrane portion 21 defines a portion of the piezoelectric layer 2 that at least partially overlaps the cavity portion 9 in the first direction Z. The functional electrode 120 is located in the membrane portion 21, and defines the excitation region.

For example, the functional electrode 120 is an IDT electrode including a plurality of electrode fingers 121 and 122, and is located between two wiring electrodes 131 and 132 as shown in FIG. 13. The plurality of electrode fingers 121 and 122 of the functional electrode 120 are located at an interval along a direction (for example, the X-direction) intersecting the first direction Z, and each extends along a direction (for example, the Y-direction) intersecting the X-direction and the first direction Z. The two wiring electrodes 131 and 132 are located with a gap therebetween along the Y-direction, and one of the electrode fingers 121 and 122 is connected to each of the wiring electrodes 131 and 132. For example, the electrode finger 121 is connected to the wiring electrode 131, and the electrode finger 122 is connected to the wiring electrode 132.

As shown in FIG. 14, the plurality of acoustic wave resonators 100 include a first resonator 101 and a second resonator 102 having a larger intersecting width of the functional electrode 120 than the first resonator 101. In FIG. 14, the intersecting width of the first resonator 101 is indicated by K1, and the intersecting width of the second resonator 102 is indicated by K2 (K1<K2). When a direction in which a current flows inside the acoustic wave resonator 100 is defined as a second direction, in FIG. 14, an intersecting width direction (for example, the Y-direction) which is an extending direction of the electrode fingers 121 and 122 is the second direction. In a cross section along the first direction Z and the second direction (for example, the Y-direction), an angle between the support substrate 110 defining a portion connected to one end of the opening 111 in the second direction in the cavity portion 9 and the piezoelectric layer 2 is defined as a taper angle. A taper angle θ1 of the first resonator 101 is larger than a taper angle θ2 of the second resonator 102. In the present example embodiment, for example, the taper angle is an obtuse angle, and intersecting widths K1 and K2 are about 20 μm to about 30 μm. Since the intersecting widths K1 and K2 are set to about 20 μm to about 30 μm, heat dissipation of the membrane portion 21 is improved, and temperatures of the first resonator 101 and the second resonator 102 are reduced or prevented. Therefore, electric power handling capability of the first resonator 101 and the second resonator 102 can be improved.

For example, the "cross section along the first direction Z and the second direction" includes a cross section along straight lines (for example, straight lines L1 and L2) forming an angle of approximately ±10 degrees with respect to the cross section along the line XIV-XIV shown in FIG. 13. The "portion connected to one end of the opening 111 in the second direction in the cavity portion 9" of the support substrate 110 is a portion forming a side surface 91 of the cavity portion 9. The side surface 91 of the cavity portion 9 is a surface intersecting a bottom surface 92 of the cavity portion 9 which faces the opening 111 in the first direction Z.

Figure 15:
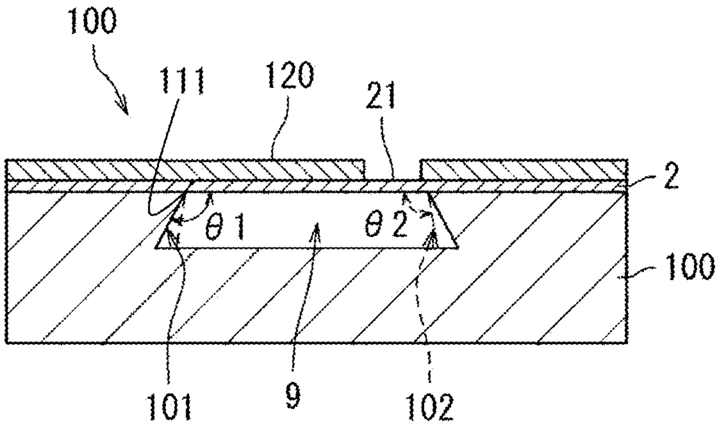
FIG. 15 is a cross-sectional view for describing a difference in volumes of a support substrate due to a magnitude of a taper angle.

In general, the acoustic wave resonator having the large intersecting width K has poor heat dissipation, and has a possibility of a failure in an electric power handling capability test. As shown in FIG. 15, when the sizes of the openings 111 are the same or substantially the same, a volume of the support substrate 110 of the second resonator 102 having a smaller taper angle than the first resonator 101 increases. When the volume of the support substrate 110 increases, the amount of heat dissipation from the membrane portion 21 to the support substrate 110 also increases. That is, since the taper angle θ2 of the second resonator 102 having the large intersecting width is set to be smaller than the taper angle θ1 of the first resonator 101, deterioration in the electric power handling capability of the second resonator 102 can be reduced or prevented. In this manner, for example, the electric power handling capability can be aligned in the plurality of acoustic wave resonators 100.

The acoustic wave device 1 includes the plurality of acoustic wave resonators 100. Each of the plurality of acoustic wave resonators 100 includes the support substrate 110, the piezoelectric layer 2 provided on the support substrate 110, and the functional electrode 120 provided on the piezoelectric layer 2. The support substrate 110 includes the cavity portion 9 provided at a position overlapping a portion of the functional electrode 120 in the first direction which is the lamination direction of the support substrate 110 and the piezoelectric layer 2. The cavity portion 9 is connected to the opening 111 located in a portion of the support substrate 110 which: faces the piezoelectric layer 2. The plurality of acoustic wave resonators 100 includes the first resonator 101 and the second resonator 102, having the larger intersecting width of the functional electrode 120 than the first resonator 101.

In a cross section along the first direction and the second direction which is the direction in which the current flows inside the acoustic wave resonator 100, when the angle formed by the support substrate 110 forming a portion connected to one end of the opening 111 in the second direction in the cavity portion 9 and the piezoelectric layer 2 is defined as the taper angle, the taper angle θ1 of the first resonator 101 is larger than the taper angle θ2 of the second resonator 102. According to this configuration, it is possible to reduce or prevent degradation in the electric power handling capability of the second resonator 102 having the larger intersecting width, in the plurality of acoustic wave resonators 100.

The acoustic wave device 1 according to the present example embodiment can also be configured as follows.

Figure 16:
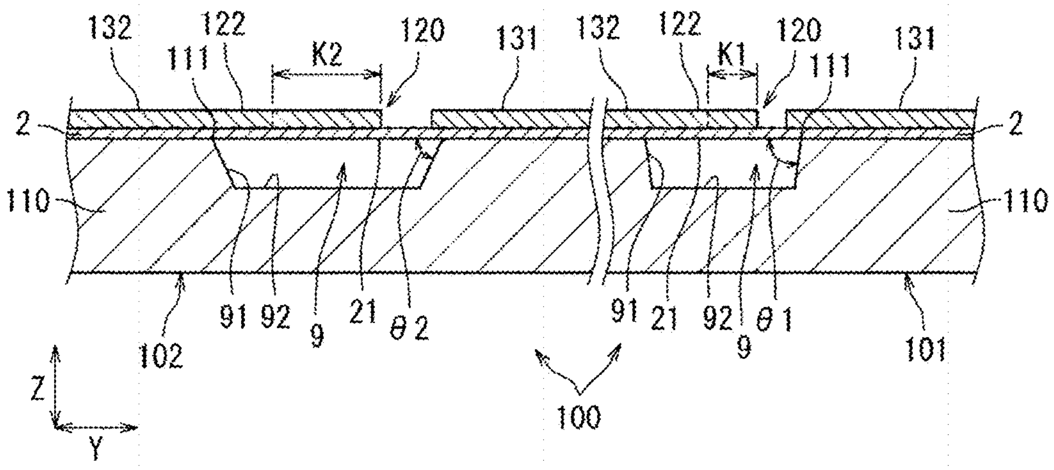
FIG. 16 is a cross-sectional view showing a first modified example of the acoustic wave device in FIG. 13.

The taper angle is not limited to an obtuse angle, and may be an acute angle as shown in FIG. 16.

Figure 17:
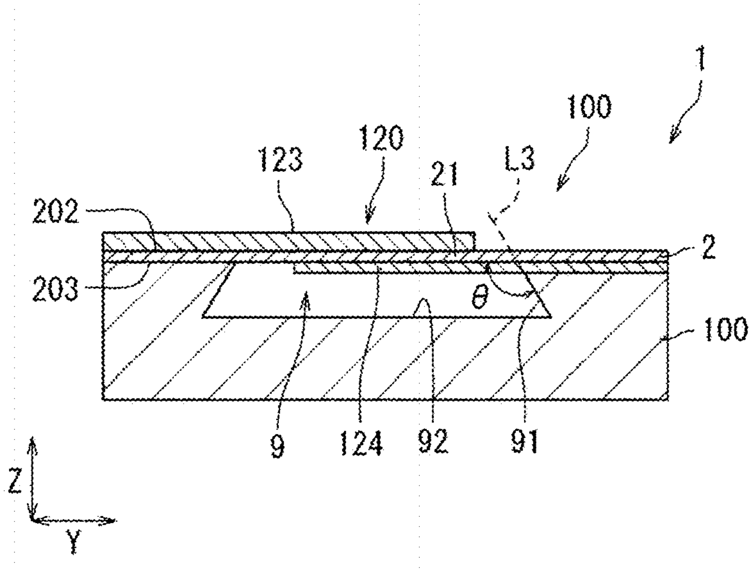
FIG. 17 is a cross-sectional view showing a second modified example of the acoustic wave device in FIG. 13.

The functional electrode 120 is not limited to the IDT electrode including the plurality of electrode fingers. For example, as shown in FIG. 17, the functional electrode 120 may be configured to include an upper electrode 123 provided on one main surface 202 of the piezoelectric layer 2 and a lower electrode 124 provided on the other main surface 203 of the piezoelectric layer 2. For example, the acoustic wave resonator 100 of the acoustic wave device 1 in FIG. 17 is a McBAW (BAW element using a single-crystal piezoelectric film (lithium niobate or lithium tantalate)), and can be formed by using a sacrificial layer method (method for forming the cavity portion 9 by using a sacrificial layer). When another layer (lower electrode 124) is interposed between the piezoelectric layer 2 and the support substrate 110, the taper angle θ is an angle between an extension line L3 of the side surface 91 of the cavity portion 9 and the piezoelectric layer 2 in a cross-sectional view along the first direction Z and the second direction (for example, the Y-direction). The upper electrode 123 and the lower electrode 124 may have a rectangular or substantially rectangular shape, or may have a polygonal or substantially polygonal shape other than the rectangular or substantially rectangular shape in a plan view along the first direction Z.

Figure 18:
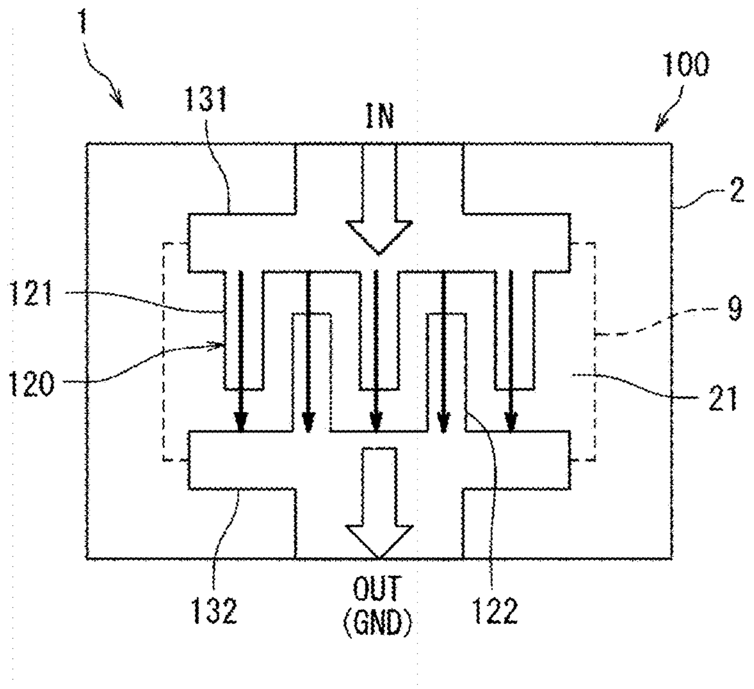
FIG. 18 is a plan view for describing a direction of a current flowing inside an acoustic wave resonator of the acoustic wave device in FIG. 13.
Figure 19:
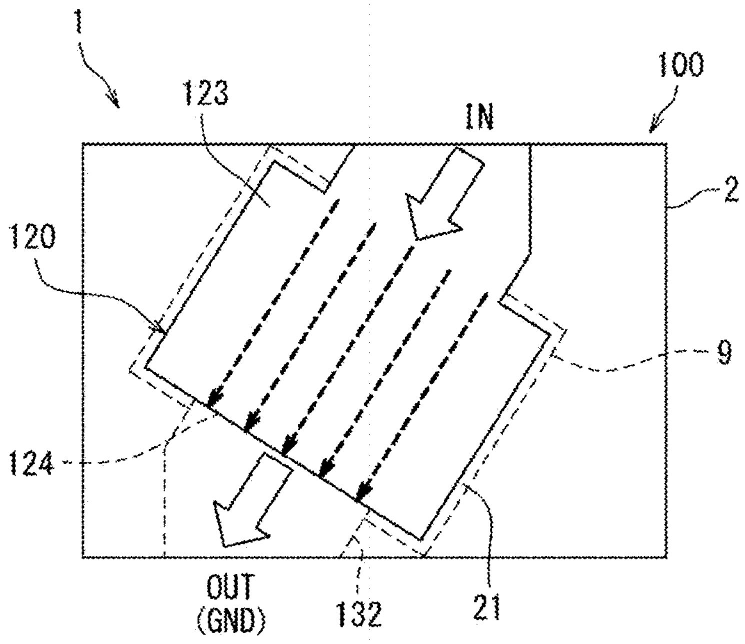
FIG. 19 is a plan view for describing a direction of the current flowing inside the acoustic wave resonator of the acoustic wave device in FIG. 17.

For example, as in the acoustic wave device 1 shown in FIG. 13, when the functional electrode 120 of the acoustic wave resonator 100 is the IDT electrode including the plurality of electrode fingers 121 and 122 (when the acoustic wave resonator 100 is an XBAR element), a current flows from an IN side toward an OUT (or GND) side as indicated by an arrow in FIG. 18, inside the acoustic wave resonator 100. A direction of the current flowing inside the acoustic wave resonator 100 in FIG. 18 substantially coincides with the extending direction of the electrode fingers 121 and 122 (intersecting width direction). For example, as in the acoustic wave device 1 shown in FIG. 17, when the functional electrode 120 of the acoustic wave resonator 100 is configured to include the upper electrode 123 and the lower electrode 124 (when the acoustic wave resonator 100 is the BAW element), the current flows from the IN side toward the OUT (or GND) side as indicated by an arrow in FIG. 19, in the acoustic wave resonator 100. In the acoustic wave resonator 100 in FIG. 19, the length in the flowing direction of the current in an overlapping portion of the upper electrode 123 and the lower electrode 124 which have different potentials facing each other is the intersecting width.

Figure 20:
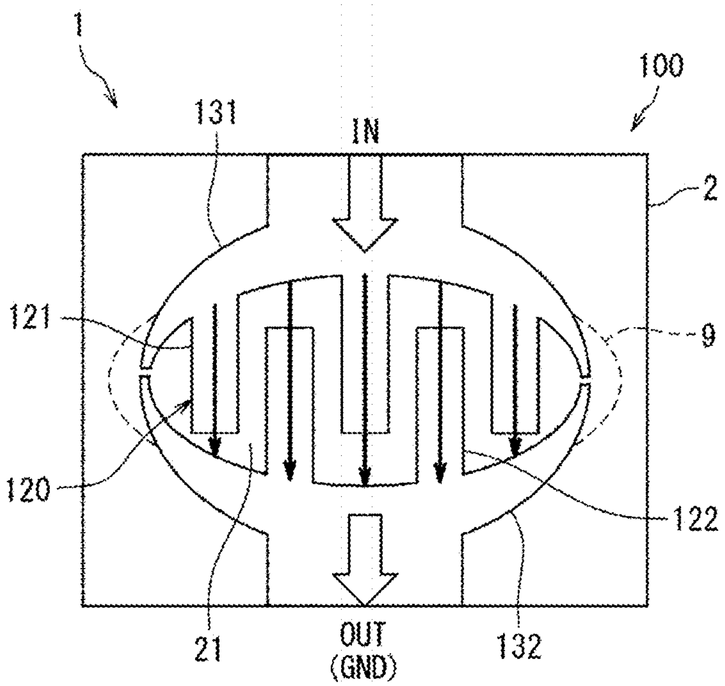
FIG. 20 is a plan view showing a third modified example of the acoustic wave device in FIG. 13.

The wiring electrodes 131 and 132 are not limited to a case of the rectangular or substantially rectangular shape in a plan view along the first direction Z. For example, as shown in FIG. 20, the wiring electrodes 131 and 132 may have a crescent or substantially crescent shape. In the acoustic wave resonator 100 in FIG. 20, the cavity portion 9 has an elliptical or substantially elliptical shape in a plan view along the first direction Z.

Figure 21:
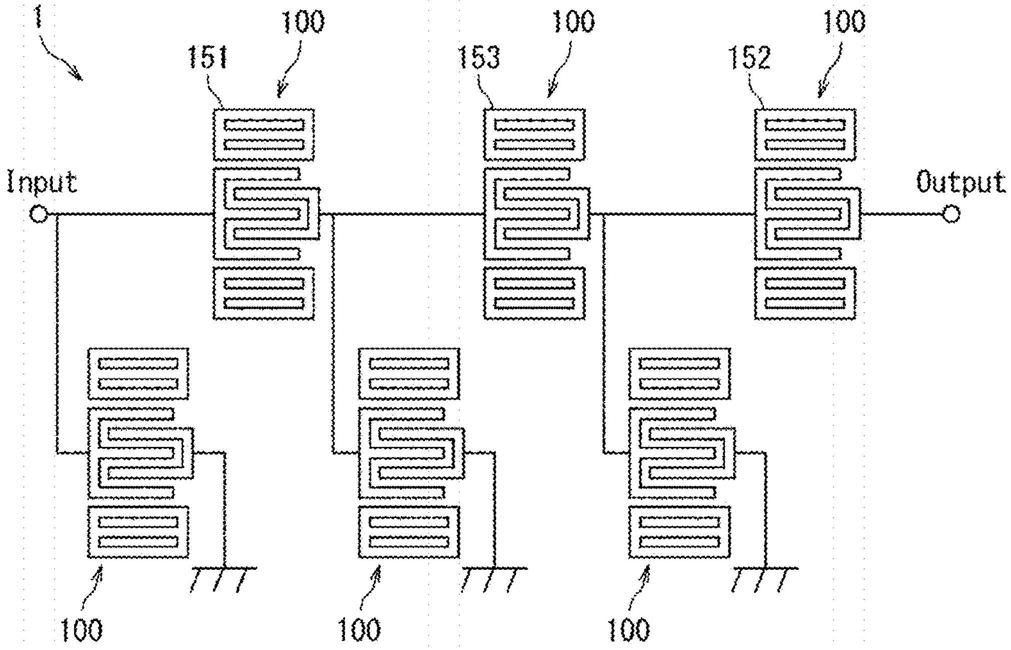
FIG. 21 is a block diagram showing a fourth modified example of the acoustic wave device in FIG. 13.

As shown in FIG. 21, the plurality of acoustic wave resonators 100 may include three or more series resonators electrically connected in series to each other. The acoustic wave device 1 in FIG. 21 includes a first series resonator 151, a second series resonator 152, and a third series resonator 153. The first series resonator 151 is located at one end in a connection direction (left-right direction in FIG. 21) of the three or more series resonators. The second series resonator 152 is located at the other end in the connection direction. The third series resonator 153 is located between the first series resonator 151 and the second series resonator 152 in the connection direction, and has the larger intersecting width than the first series resonator 151 and the second series resonator 152. In the acoustic wave device 1 in FIG. 21, the taper angle of the third series resonator 153 is smaller than the taper angles of the first series resonator 151 and the second series resonator 152.

Figure 22:
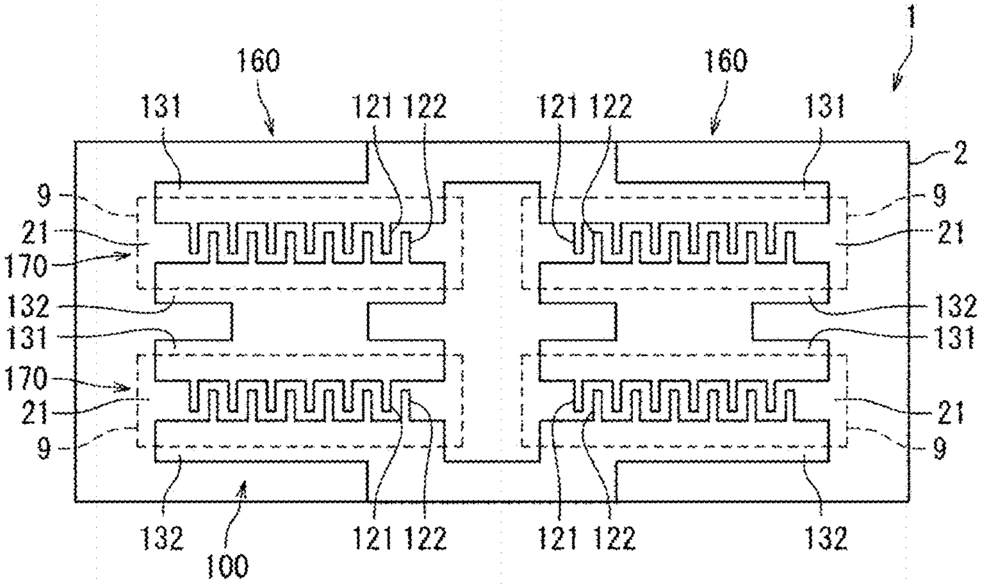
FIG. 22 is a plan view showing a fifth modified example of the acoustic wave device in FIG. 13.

Any of the plurality of acoustic wave resonators 100 may be divided in series into a plurality of serially divided resonators, and at least one of the serially divided resonators may be divided in parallel into a plurality of parallelly divided resonators. FIG. 22 shows an example of the acoustic wave device 1 which is divided in series into two serially divided resonators 160 and divided in parallel into two parallelly divided resonators 170.

In general, when any of the plurality of acoustic wave resonators is divided in series into the plurality of serially divided resonators, the electric power handling capability is improved. However, the size of the membrane portion increases. Therefore, in some cases, heat dissipation and strength of the membrane portion may be degraded. For example, when one acoustic wave resonator is divided in series into two stages, the size of the membrane portion increases to approximately four times. As shown in FIG. 22, since at least one serially divided resonator 160 is divided in parallel into the plurality of parallelly divided resonators 170, the size of the membrane portion 21 can be reduced, compared to when at least one serially divided resonator 160 is not divided in parallel. In this manner, when any of the plurality of acoustic wave resonators is divided in series into the plurality of serially divided resonators, it is possible to sufficiently obtain an advantageous effect of improving the electric power handling capability by dividing any of the plurality of acoustic wave resonators in series, while degradation of the heat dissipation and the strength of the membrane portion 21 can be reduced or prevented.

The two serially divided resonators 160 include the cavity portions 9 which are independent of each other. For example, the cavity portions 9 of the two serially divided resonators 160 have a rectangular or substantially rectangular shape in a plan view along the first direction Z. However, the present invention is not limited to this configuration. The cavity portions 9 may have an elliptical or substantially elliptical shape. One may have a rectangular or substantially rectangular shape, and the other may have an elliptical or substantially elliptical shape. In this manner, it is possible to improve the electric power handling capability of each of the serially divided resonators 160. Without being limited to the example in FIG. 22, any of the plurality of acoustic wave resonators 100 may be divided in series into the plurality of serially divided resonators, and at least two serially divided resonators may have the cavity portions 9 which are independent of each other.

FIGS. 23 to 26 show an example of the acoustic wave device 1 together with the flowing direction of the current.

Figure 23:
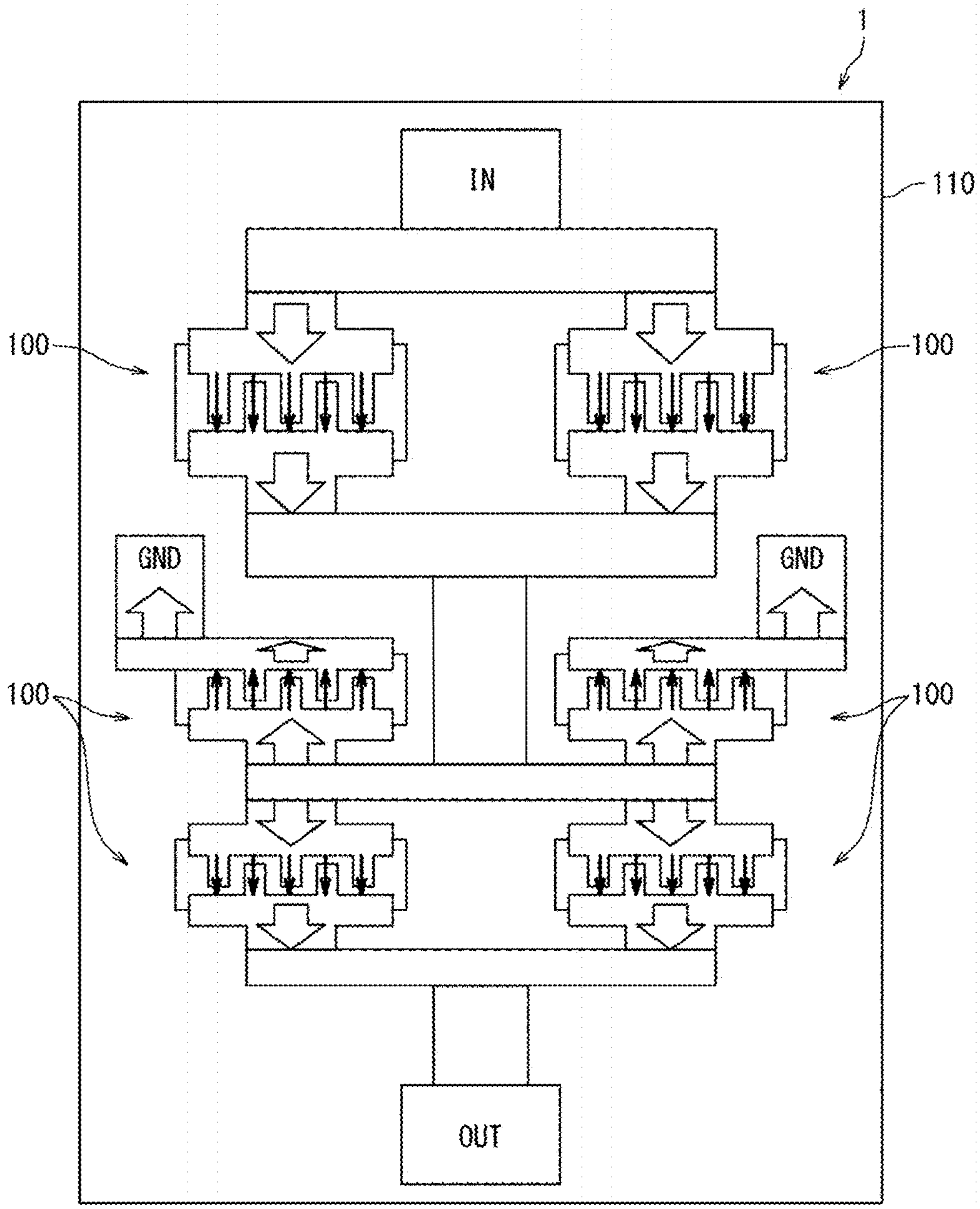
FIG. 23 is a plan view showing a sixth modified example of the acoustic wave device in FIG. 13.
Figure 24:
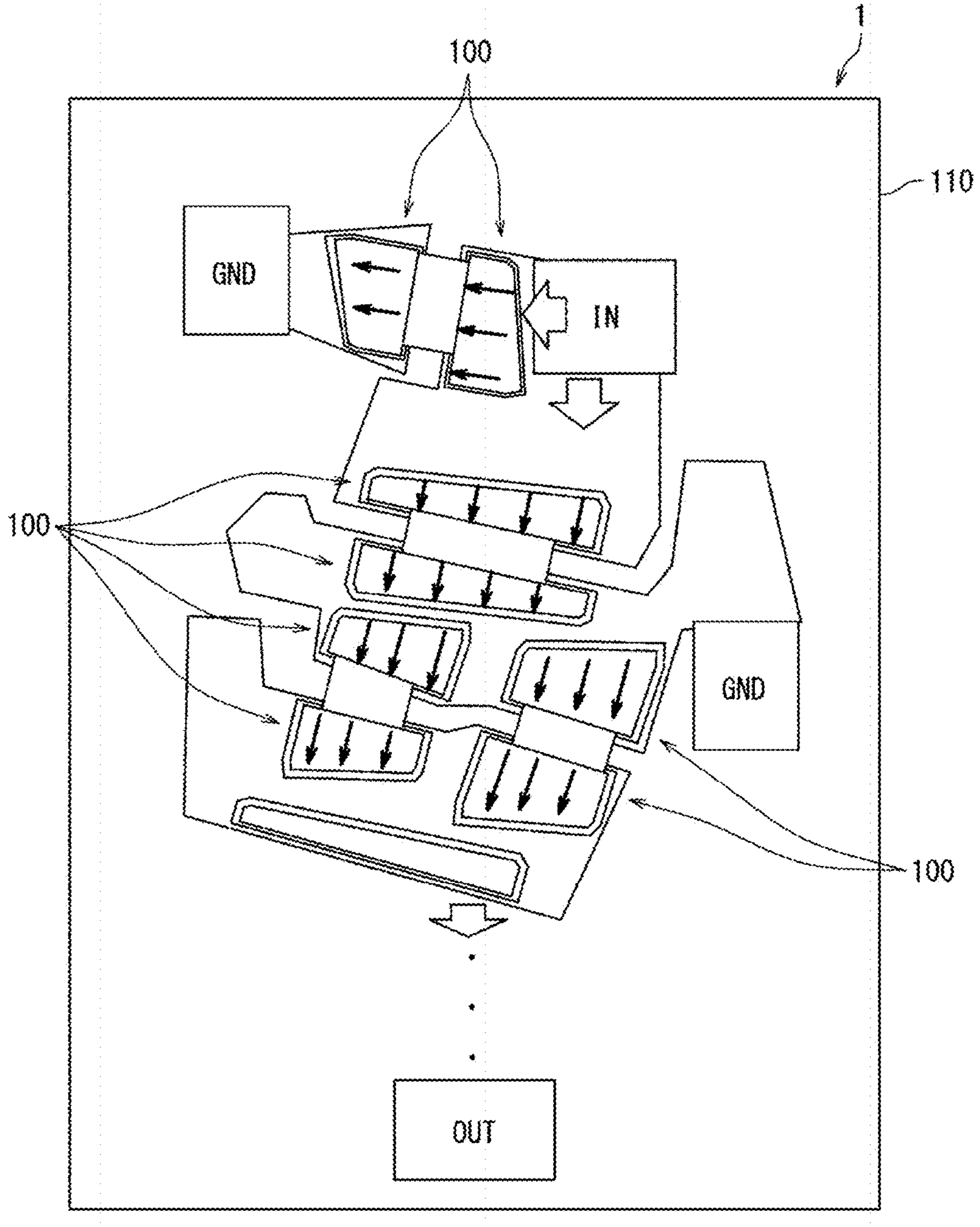
FIG. 24 is a plan view showing a seventh modified example of the acoustic wave device in FIG. 13.
Figure 25:
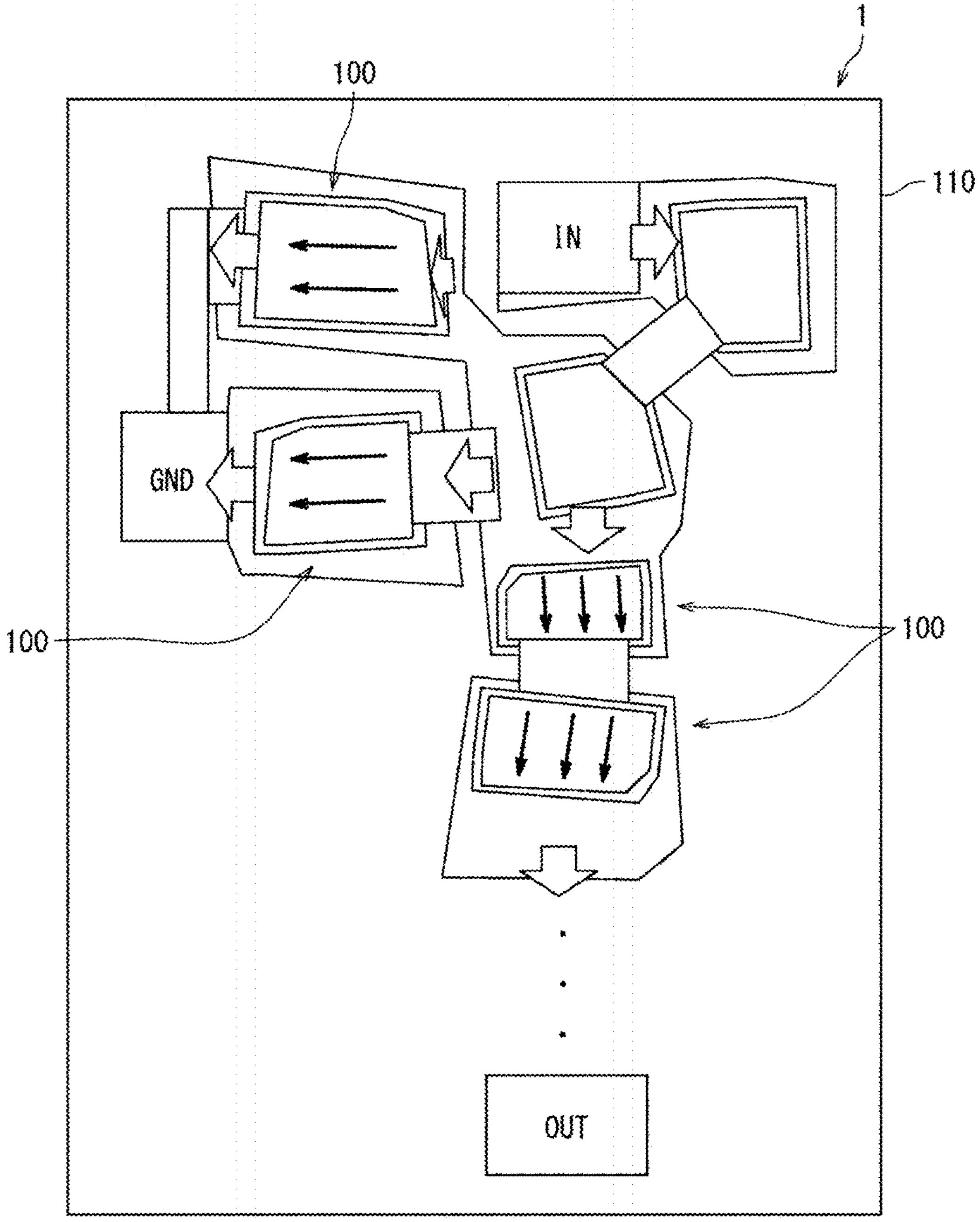
FIG. 25 is a plan view showing an eighth modified example of the acoustic wave device in FIG. 13.
Figure 26:
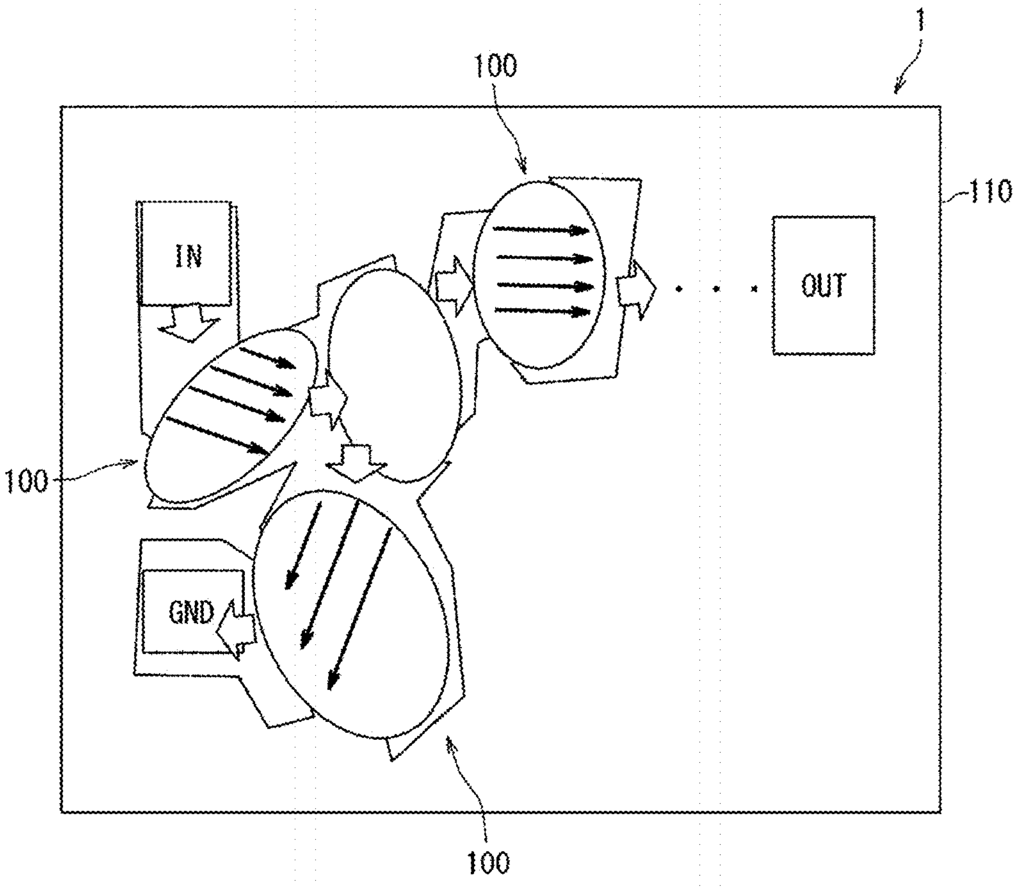
FIG. 26 is a plan view showing a ninth modified example of the acoustic wave device in FIG. 13.

In the acoustic wave device 1 in FIG. 23, each of the acoustic wave resonators 100 includes, for example, the XBAR element. In the acoustic wave device 1 in FIGS. 24 to 26, each of the acoustic wave resonators 100 includes, for example, the BAW element. In the acoustic wave device 1 of the present example embodiment, the number and disposition of the acoustic wave resonators 100, the position on the IN side, the position on the OUT side, the position and the number of the GNDs, and the like can be changed in any way.

The acoustic wave resonator 100 can be manufactured by any method such as, for example, a method for forming the cavity portion 9 by using the sacrificial layer, a method for etching the support substrate 110 from a back surface, or the like.

For example, the support substrate 110 may include only the support 8, or may include the support 8 and the insulating layer (bonding layer) 7 provided on the support 8.

At least a portion of the configuration of the acoustic wave resonator 100 according to the present example embodiment may be added to acoustic wave devices according to other example embodiments, or at least a portion of the configurations of an acoustic wave device according to an example embodiment may be added to the acoustic wave resonator 100.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a plurality of acoustic wave resonators; wherein each of the plurality of acoustic wave resonators includes a support substrate, a piezoelectric body layer on the support substrate, and a functional electrode on the piezoelectric body layer;

the support substrate includes a cavity portion at a position overlapping a portion of the functional electrode in a first direction which is a lamination direction of the support substrate and the piezoelectric body layer;

the cavity portion is connected to an opening located in a portion of the support substrate which faces the piezoelectric body layer;

the plurality of acoustic wave resonators include a first resonator and a second resonator, the first and second resonators being included in the each of the plurality of acoustic wave resonators, and the second resonator having a larger intersecting width of the functional electrode than the first resonator; and in a cross section along the first direction and a second direction which is a direction in which a current flows inside the acoustic wave resonator, a taper angle is defined between a side surface of the cavity portion and the piezoelectric body layer, the taper angle of the first resonator is larger than the taper angle of the second resonator.

2. The acoustic wave device according to claim 1, wherein the taper angle is an acute angle.

3. The acoustic wave device according to claim 1, wherein the taper angle is an obtuse angle.

4. The acoustic wave device according to claim 1, wherein the functional electrode includes an upper electrode on one main surface of the piezoelectric body layer and a lower electrode on another main surface of the piezoelectric body layer.

5. The acoustic wave device according to claim 4, wherein the piezoelectric body layer includes single-crystal lithium niobate or lithium tantalate.

6. The acoustic wave device according to claim 1, wherein the plurality of acoustic wave resonators include three or more series resonators electrically connected in series to each other, the three or more series resonators being included in the each of the plurality of acoustic wave resonators; when in the three or more series resonators, a series resonator located at one end in a connection direction of the three or more series resonators is defined as a first series resonator, a series resonator located at another end in the connection direction is defined as a second series resonator, and a series resonator located between the first series resonator and the second series resonator in the connection direction is defined as a third series resonator;

the intersecting width of the third series resonator is larger than the intersecting widths of the first series resonator and the second series resonator, and the taper angle of the third series resonator is smaller than taper angles of the first series resonator and the second series resonator; and the second resonator is defined by the third series resonator and the first resonator is defined by one of the first and second series resonators.

7. The acoustic wave device according to claim 1, wherein the intersecting width of the functional electrode of the second resonator is about 20 μm to about 50 μm.

8. The acoustic wave device according to claim 1, wherein any one of the plurality of acoustic wave resonators is divided in series into a plurality of serially divided resonators; and at least one of the serially divided resonators is divided in parallel into a plurality of parallelly divided resonators.

9. The acoustic wave device according to claim 1, wherein any one of the plurality of acoustic wave resonators is divided in series into a plurality of serially divided resonators; and at least two of the serially divided resonators include the cavity portions which are independent of each other.

10. The acoustic wave device according to claim 1, wherein the functional electrode is an IDT electrode.

11. The acoustic wave device according to claim 10, wherein the piezoelectric body layer includes lithium niobate or lithium tantalate;

the IDT electrode includes a first electrode finger and a second electrode finger which face each other in a direction intersecting the first direction and the second direction;

the first electrode finger and the second electrode finger are adjacent to each other; and when a thickness of the piezoelectric body layer is defined as d and a center-to-center distance of the first electrode finger and the second electrode finger is defined as p, d/p is about 0.5 or smaller.

12. The acoustic wave device according to claim 11, wherein d/p is about 0.24 or smaller.

13. The acoustic wave device according to claim 11, wherein in a direction intersecting the first direction, a metallization ratio MR which is a ratio of areas of the first electrode finger and the second electrode finger inside an excitation region which is a region where the first electrode finger and the second electrode finger overlap each other, to the excitation region, satisfies MR≤about 1.75 (d/p)+0.075.

14. The acoustic wave device according to claim 11, wherein

Euler angles (φ, θ, and ψ) of the lithium niobate or the lithium tantalate are in a range of Expression (1), Expression (2), or Expression (3):

$$(0° \pm 10°,\ 0° \text{ to } 20°,\ \text{any } \Psi); \quad \text{Expression (1)}$$

$$\left(0° \pm 10°,\ 20° \text{ to } 80°,\ 0° \text{ to } 60°\left(1-(\theta-50)^2/900\right)^{1/2}\right) \text{ or } \left(0° \pm 10°,\ 20° \text{ to } 80°,\ \left[180° - 60°\left(1-(\theta-50)^2/900\right)^{1/2}\right] \text{ to } 180°\right); \text{ and} \quad \text{Expression (2)}$$

$$\left(0° \pm 10°,\ \left[180° - 30°\left(1-(\Psi-90)^2/8100\right)^{1/2}\right] \text{ to } 180°,\ \text{any } \Psi\right). \quad \text{Expression (3)}$$

15. The acoustic wave device according to claim 10, wherein the piezoelectric body layer includes lithium niobate or lithium tantalate; and the acoustic wave device is structured to generate a bulk wave in a thickness shear mode.

16. The acoustic wave device according to claim 1, wherein the piezoelectric body layer includes lithium niobate or lithium tantalate; and the acoustic wave device is structured to generate a plate wave.

17. The acoustic wave device according to claim 1, wherein a thickness of the piezoelectric body layer is about 50 nm or more and about 1000 nm or smaller.

18. The acoustic wave device according to claim 11, wherein a pitch between the first and second electrode fingers is about 1 μm or larger and about 10 μm or smaller.

19. The acoustic wave device according to claim 11, wherein a width of each of the first and second electrode fingers is about 150 nm or more and about 1000 nm or smaller.

20. The acoustic wave device according to claim 1, wherein the support substrate includes a support including Si and an insulating layer including silicon oxide.

* * * * *